US007002379B2

(12) United States Patent
Ajit

(10) Patent No.: US 7,002,379 B2
(45) Date of Patent: *Feb. 21, 2006

(54) I/O CIRCUIT USING LOW VOLTAGE TRANSISTORS WHICH CAN TOLERATE HIGH VOLTAGES EVEN WHEN POWER SUPPLIES ARE POWERED OFF

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/966,065

(22) Filed: Oct. 18, 2004

(65) Prior Publication Data

US 2005/0127957 A1    Jun. 16, 2005

Related U.S. Application Data

(63) Continuation of application No. 10/617,874, filed on Jul. 14, 2003, now Pat. No. 6,859,074, which is a continuation-in-part of application No. 10/043,788, filed on Jan. 9, 2002, now Pat. No. 6,628,149, said application No. 10/617,874.

(60) Provisional application No. 60/427,954, filed on Nov. 21, 2002, provisional application No. 60/260,582, filed on Jan. 9, 2001, provisional application No. 60/260,580, filed on Jan. 9, 2001.

(51) Int. Cl.
*H03B 1/00* (2006.01)
(52) U.S. Cl. ..................... 327/108; 327/333; 326/81; 326/83; 326/86
(58) Field of Classification Search ................ 327/333, 327/112, 108, 379, 382, 387, 389; 326/62, 326/63, 65, 80, 81, 83, 86, 87
See application file for complete search history.

(56) References Cited

U.S. PATENT DOCUMENTS 4,473,758 A    9/1984  Huntington ................. 327/537
(Continued)

FOREIGN PATENT DOCUMENTS

DE           19521751         2/1996
(Continued)
(Continued)

OTHER PUBLICATIONS

Deng-Yuan Chen, "Design of a Milxed 3.3V and 5V PCI I/O Buffer," 2$^{nd}$ *International Conference on ASIC Proceedings*, pp. 336-339 (Oct. 21-24, 1996).
(Continued)

*Primary Examiner*—Tuan T. Lam
(74) *Attorney, Agent, or Firm*—Sterne, Kessler, Goldstein & Fox PLLC

(57) ABSTRACT

An apparatus for providing bias voltages for input/output (I/O) connections on low voltage integrated circuits. In one embodiment, the invention comprises an I/O pad, a pull-down transistor device that has a protective transistor coupled to said I/O pad, and a pull-up transistor device that has a second protective transistor, coupled to said I/O pad. A first switch coupled to the first protective transistor is responsive to a first supply voltage, a second supply voltage, and a reference voltage. Likewise, a second switch coupled to the second protective transistor is responsive to the first supply voltage and the reference voltage. A first self-bias circuit is also coupled to the first switch, wherein said the self-bias circuit uses a voltage at said I/O pad to bias the first protective transistor when both of the first and second supply voltages are powered off. Likewise, a second self-bias circuit coupled to the second switch, wherein the second self-bias circuit also uses the voltage at the I/O pad and an output of the first self bias circuit, to bias the second protective transistor when the first supply voltage is powered off.

2 Claims, 27 Drawing Sheets

U.S. PATENT DOCUMENTS

| | | | |
|---|---|---|---|
| 4,556,804 A | 12/1985 | Dewitt | 327/434 |
| 5,170,078 A | 12/1992 | Hsueh et al. | 326/84 |
| 5,184,031 A | 2/1993 | Hayakawa et al. | 327/544 |
| 5,208,488 A | 5/1993 | Takiba et al. | 327/77 |
| 5,350,951 A | 9/1994 | Adachi | 327/546 |
| 5,444,272 A | 8/1995 | Ajit | 257/137 |
| 5,474,946 A | 12/1995 | Ajit et al. | 438/138 |
| 5,483,087 A | 1/1996 | Ajit | 257/120 |
| 5,498,884 A | 3/1996 | Ajit | 257/137 |
| 5,506,535 A | 4/1996 | Ratner | 327/333 |
| 5,528,447 A | 6/1996 | McManus et al. | 361/56 |
| 5,557,127 A | 9/1996 | Ajit et al. | 257/339 |
| 5,581,100 A | 12/1996 | Ajit | 257/331 |
| 5,623,151 A | 4/1997 | Ajit | 257/212 |
| 5,629,535 A | 5/1997 | Ajit | 257/120 |
| 5,646,809 A | 7/1997 | Motley et al. | 361/56 |
| 5,654,858 A | 8/1997 | Martin et al. | 361/56 |
| 5,719,411 A | 2/1998 | Ajit | 257/132 |
| 5,757,033 A | 5/1998 | Ajit | 257/120 |
| 5,757,034 A | 5/1998 | Ajit | 257/133 |
| 5,783,474 A | 7/1998 | Ajit | 438/279 |
| 5,793,066 A | 8/1998 | Ajit | 257/152 |
| 5,834,948 A * | 11/1998 | Yoshizaki et al. | 326/81 |
| 5,852,375 A | 12/1998 | Byrne et al. | 327/108 |
| 5,877,515 A | 3/1999 | Ajit | 257/76 |
| 5,896,045 A * | 4/1999 | Siegel et al. | 326/81 |
| 5,909,142 A | 6/1999 | Kawasaki et al. | 327/543 |
| 5,910,664 A | 6/1999 | Ajit | 257/212 |
| 5,914,626 A | 6/1999 | Kim et al. | 327/309 |
| 6,005,413 A | 12/1999 | Schmitt | 326/80 |
| 6,018,257 A | 1/2000 | Hung et al. | 327/112 |
| 6,031,394 A | 2/2000 | Cranford, Jr. et al. | 326/81 |
| 6,054,888 A | 4/2000 | Maley | 327/333 |
| 6,064,227 A * | 5/2000 | Saito | 326/68 |
| 6,072,351 A | 6/2000 | Sharpe-Geisler | 327/328 |
| 6,081,132 A | 6/2000 | Isbara | 326/81 |
| 6,081,412 A | 6/2000 | Duncan et al. | 361/86 |
| 6,130,556 A | 10/2000 | Schmitt et al. | 326/81 |
| 6,140,846 A | 10/2000 | Chan et al. | 327/108 |
| 6,147,846 A | 11/2000 | Borg | 361/91.1 |
| 6,160,428 A | 12/2000 | Pasqualini | 327/142 |
| 6,194,944 B1 | 2/2001 | Wert | 327/327 |
| 6,236,236 B1 | 5/2001 | Chen | 326/81 |
| 6,351,157 B1 | 2/2002 | Sharpe-Geisler | 327/108 |
| 6,388,499 B1 * | 5/2002 | Tien et al. | 327/333 |
| 6,392,439 B1 | 5/2002 | Tanaka et al. | 326/68 |
| 6,429,716 B1 | 8/2002 | Drapkin et al. | 327/333 |
| 6,583,644 B1 | 6/2003 | Shin | 326/26 |
| 6,628,149 B1 | 9/2003 | Ajit | 327/108 |
| 6,729,716 B1 | 5/2004 | Eguchi et al. | 347/70 |

FOREIGN PATENT DOCUMENTS

| | | |
|---|---|---|
| DE | 19523172 | 2/1996 |
| DE | 19526537 | 2/1996 |
| DE | 19530109 | 4/1996 |
| DE | 19547756 | 8/1996 |
| DE | 19641839 | 5/1997 |
| DE | 19638381 | 6/1997 |
| EP | 0 327 159 A1 | 8/1989 |
| EP | 0 902 517 A2 | 3/1999 |
| EP | 0 902 517 A3 | 1/2000 |
| FR | 2722335 | 1/1996 |
| FR | 2723259 | 2/1996 |
| FR | 2723260 | 2/1996 |
| FR | 2725308 | 4/1996 |
| FR | 2730859 | 8/1996 |
| FR | 2739224 | 3/1997 |
| FR | 2740907 | 5/1997 |
| GB | 2290659 A | 1/1996 |
| GB | 2306250 | 4/1997 |
| JP | 8-051197 | 2/1996 |
| JP | 8-083897 | 3/1996 |
| JP | 8-107204 | 4/1996 |
| JP | 8-172181 | 7/1996 |
| JP | 8-250512 | 9/1996 |
| JP | 9-116134 | 5/1997 |
| JP | 9-172159 | 6/1997 |
| WO | WO 98/20562 | 5/1998 |
| WO | WO 00/38322 | 6/2000 |

OTHER PUBLICATIONS

International Search Report dated Apr. 13, 2003 PCT/US02/38489.

Supplementary European Search Report issued Apr. 27, 2005 for Appln. No. EP 02804487, 4 pages.

* cited by examiner

I/O CIRCUIT USING LOW VOLTAGE TRANSISTORS WHICH CAN TOLERATE HIGH VOLTAGES EVEN WHEN POWER SUPPLIES ARE POWERED OFF

CROSS-REFERENCE TO RELATED APPLICATIONS

This application is a continuation of U.S. Non-Provisional application entitled "I/O Circuit Using Low Voltage Transistors Which Can Tolerate High Voltages Even When Power Supplies are Powered Off," Ser. No. 10/617,874, filed Jul. 14, 2003, now U.S. Pat. No. 6,859,074, which is a continuation-in-part of U.S. Non-Provisional application Ser. No. 10/043,788, filed Jan. 9, 2002, now U.S. Pat. No. 6,628,149, which claims the benefit of U.S. Provisional Application No. 60/260,580, filed Jan. 9, 2001, and U.S. Provisional Application No. 60/260,582, filed Jan. 9, 2001, all three of which are hereby incorporated by reference in their entirety; and U.S. Non-Provisional application Ser. No. 10/617,874, filed Jul. 14, 2003 also claims the benefit of U.S. Provisional Application No. 60/427,954, filed Nov. 21, 2002, which is hereby incorporated by reference in its entirety.

BACKGROUND OF THE INVENTION

1. Field of the Invention

The present invention relates to integrated circuits (ICs), such as interface circuits, that are designed having reduced feature sizes, for example, 0.13 µm. More particularly, the invention relates to ICs that include interfaces (such as input/output (I/O) circuits) that are capable of interfacing with comparatively high-voltage signals from other sources, for example a 3.3 volt IC interfacing with signals from a 5 volt IC, or any other disparate ranges. Moreover, the invention relates to integrated circuits in which the semiconductor devices are biased such that the stress across the gate-oxides and junctions, as well as the leakage currents, are maintained at tolerable levels.

2. Related Art

The trend in CMOS-based processing technology is to produce integrated circuit (IC) cores having a higher density of semiconductor devices, such as transistors, and faster clock rates than their predecessors. I/O circuits, which electrically couple an IC core to external components, are accessed through I/O circuit pads that surround the IC core. The IC core and the I/O circuit pads are generally fabricated from the same processing technology. There is however no requirement that they comprise the same technology and hybrid circuits are known in the art. The inventive concepts herein are applicable to a variety of fabrication technologies.

The performance of the IC cores may generally be improved by shrinking the feature sizes of the semiconductor devices, for example field-effect transistors (FETs). Unfortunately, reducing the IC feature sizes may proportionally decrease the maximum operating voltage that the semiconductor devices within the IC can withstand. For example, an I/O circuit pad, fabricated from a CMOS process having 0.30 micron features, typically withstands a maximum operating voltage of about 3.6 volts. In such a case the maximum operating voltage of the I/O circuit pad is insufficient to drive the external components which have a higher voltage requirement, such as 5 volts. Furthermore, if the IC is interfaced with a greater than the maximum operating voltage, the IC may fail.

One way to attempt to resolve such requirements of circuits with mismatched voltage requirements is to increase the robustness of the fabrication process, for example by increasing the thickness of the gate-oxide layer of the semiconductor devices which comprise the IC circuitry. A thick gate-oxide layer may provide semiconductor devices, such as FETs, with the ability to support a higher voltage requirement. However, this voltage robustness is commonly accompanied by a decrease in the performance of the IC, because the thick gate-oxide layer reduces the overall gain of the devices which comprise the IC. Reducing the gain minimizes the benefit which occurs by reducing the feature size.

Other attempts have included increasing the complexity of the CMOS fabrication process so there are multiple sets of devices where each set meets different voltage requirements. Each set of devices requires a different gate-oxide. Each additional gate-oxide requires a separate mask. The resulting hybrid process may significantly increase the manufacturing costs of the IC.

One way to avoid the drawbacks of the aforementioned processing-based solutions is to use a "level-shift" chip as an external component. The IC core and the I/O circuits are fabricated from the same process. The "level-shift chip" may be fabricated from a process that supports the discrete voltage requirement by stepping up the core output signals to support the discrete voltage range and stepping down the external drive signals to support the IC core voltage range. Such a level-shift chip can be a waste of much needed space on a crowded printed circuit board and may degrade performance.

An I/O circuit that transforms voltages between different voltage levels without degrading the overall performance of the integrated circuit and maximizing use of space on the printed circuit board or multi-chip substrate may be beneficial. It would be a further benefit if such an I/O circuit could use voltages presented at the I/O circuit in order to provide such protective biasing.

Commonly an I/O power supply may vary +/−10% and may vary significantly more during transient conditions. When the I/O power supply varies, circuits may have higher stress on the gate-oxides of the devices in the I/O circuit, such stresses may not be desirable in many process technologies. It would be desirable to provide bias voltages to various devices in the I/O circuit such that the device gate-oxide is protected from high-voltages under various conditions of operation even when the power-supply voltage varies by a large amount, or when the power-supplies are powered off.

Embodiments of the present invention may be optimized, for example where 5 volt input tolerance is required, even when the power supplies are varying in steady state by +/−10%, or are powered off.

Embodiments of the present invention are illustrated in an optimized form for I/O circuits where a 5 volt +/−10% input tolerance is required for normal operating range. Additionally the inventive concepts herein are described in terms of CMOS (Complimentary Metal Oxide Semiconductor) integrated circuits. Those skilled in the art will readily appreciate the fact that techniques described with respect to CMOS ICs are readily applicable to any circuits having disparate power supply and/or drive signal requirements for different portions of the circuitry. The CMOS example chosen is one likely to be familiar to those skilled in the art. There is, however, no intent to limit the inventive concepts to CMOS ICs as the techniques are equally applicable to a wide variety of integrated circuit fabrication techniques.

SUMMARY OF THE INVENTION

An exemplary embodiment of the invention includes an integrated circuit having a four device input output circuit in a push pull configuration. Two of the devices, termed upper devices, comprise PMOS (P-Channel Metal Oxide Semiconductor) devices and two of the devices, termed lower devices, comprise NMOS (N-channel Metal Oxide Semiconductor) devices. The devices are biased to eliminate hazardous voltages across device junctions and to reduce the magnitude of the voltage being passed on to the core circuitry. The biases are derived from the input output state of the circuit, a plurality of power supply voltages, and the voltage presented to the I/O circuit connection ($V_{PAD}$). Additionally PMOS device well bias voltage may be developed based on $V_{PAD}$. In a particular embodiment, the bias will be maintained even when the plurality of reference voltages are powered off, as is the case in power management mode.

An apparatus for providing bias voltages for input/output (I/O) connections on low voltage integrated circuits is disclosed. In one embodiment, the invention comprises an I/O pad, a pull-down transistor device that has a protective transistor coupled to said I/O pad, and a pull-up transistor device that has a second protective transistor, coupled to said I/O pad. A first switch coupled to the first protective transistor is responsive to a first supply voltage, a second supply voltage, and a reference voltage. Likewise, a second switch coupled to the second protective transistor is responsive to the first supply voltage and the reference voltage. A first self-bias circuit is also coupled to the first switch, wherein said the self-bias circuit uses a voltage at said I/O pad to bias the first protective transistor when both of the first and second supply voltages are powered off. Likewise, a second self-bias circuit coupled to the second switch, wherein the second self-bias circuit also uses the voltage at the I/O pad and an output of the first self bias circuit, to bias the second protective transistor when the first supply voltage is powered off.

BRIEF DESCRIPTION OF THE DRAWINGS/FIGURES

Other features and advantages of the invention will become apparent from a description of the following figures, in which like numbers refer to similar items throughout.

DETAILED DESCRIPTION OF THE INVENTION

Figure 1:
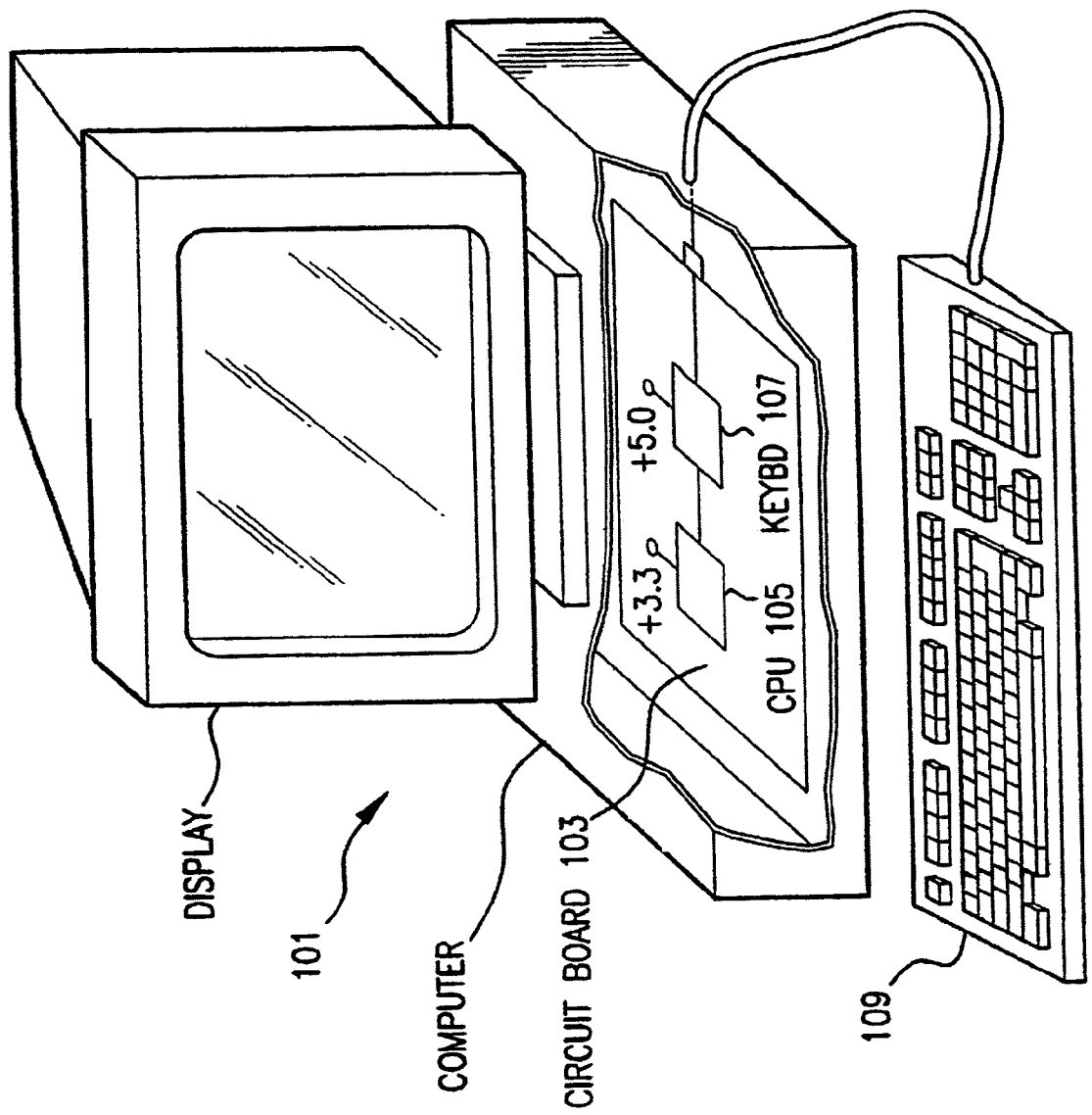
FIG. 1 is a graphic illustration of an exemplary environment in which embodiments of the invention may be utilized.

FIG. 1 is a graphic illustration of an exemplary environment in which embodiments of the invention may be utilized. In FIG. 1 a personal computer system is represented generally at 101. Within the computer system is circuit board 103 on which a CPU integrated circuit chip 105 is mounted. The CPU is a type which uses 3.3 volts as its supply voltage. A keyboard interface integrated circuit chip 107 is also mounted on circuit board 103. The keyboard interface integrated circuit uses a supply voltage of 5.0 volts. The CPU 105 is coupled to the Keyboard chip 107. The CPU 105 may be of a type which contains integrated devices that may be damaged by interfacing with a device having a higher supply voltage. Because of the disparity in supply voltages that may exist in such situations an output circuit which can compensate for the higher interface voltages may be useful.

Figure 2:
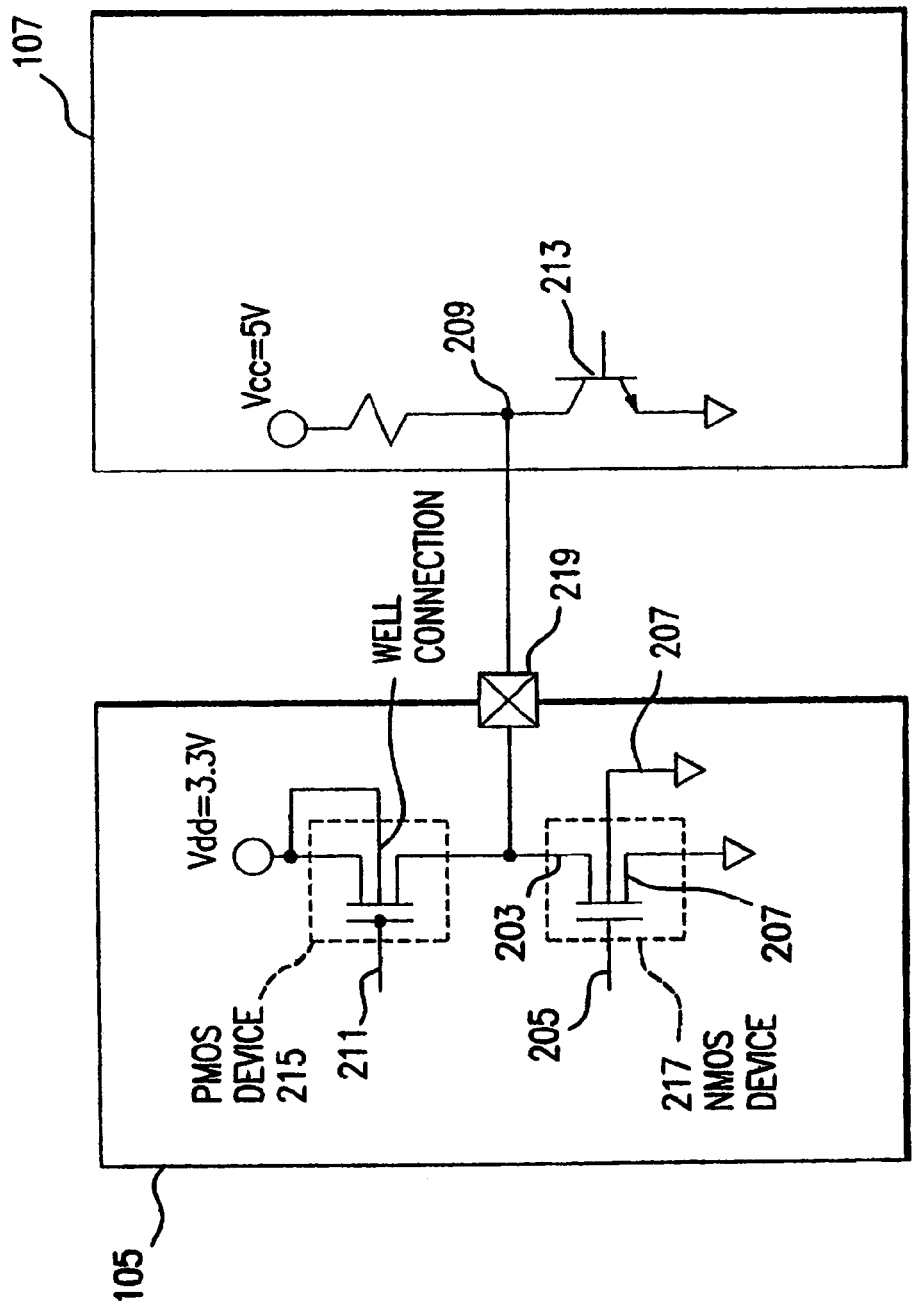
FIG. 2 is a graphical illustration of a prior art input output circuit and connection.

FIG. 2 is a graphical illustration of a prior art input output circuit and connection. A common input output circuit comprises a pull up device, such as PMOS (P-channel Metal Oxide Semiconductor) device 215 and a pull down device, such as NMOS (N-channel Metal Oxide Semiconductor) device 217, such as illustrated in FIG. 2. Devices 215 and 217 are coupled together at an input/output (I/O) pad 219. The substrate for the NMOS device is commonly coupled to ground potential, e.g. as shown at 221. The substrate for the NMOS device is typically a substrate which is common for the entire integrated circuit chip on which it resides. PMOS devices are commonly fabricated in their own isolated well.

Circuit 105 is an inverting push/pull device. An information signal is received at the gates 211 and 205 of transistors 215 and 217. If the signal at gates 211 and 205 is high, then NMOS device 217 will conduct and the I/O pad 219 will be pulled to the low reference voltage. If the signal at gates 211 and 205 is low, then PMOS device 215 will conduct, and the I/O pad 219 will be pulled to the high reference voltage Vdd.

In deep submicron fabrication, the component integrated devices can tolerate only limited differential voltages across their junctions. Commonly the voltage which can be tolerated across the junctions is on the order of 2.5 Volts.

In the illustration of FIG. 2, pad 219 interfaces to a 5 volt circuit, and hence the pad may commonly see voltages in the neighborhood of 5.5 volts. A 5 volt signal applied to pad 219 may stress devices within the chip 105. For example if gate 205 of device 217 is at a zero volt potential then the voltage across the 205–203 gate-oxide can exceed 5 volts, thereby stressing device 217. For this reason more than one device may be used to divide the voltages in pull up and pull down I/O circuits.

Figure 3:
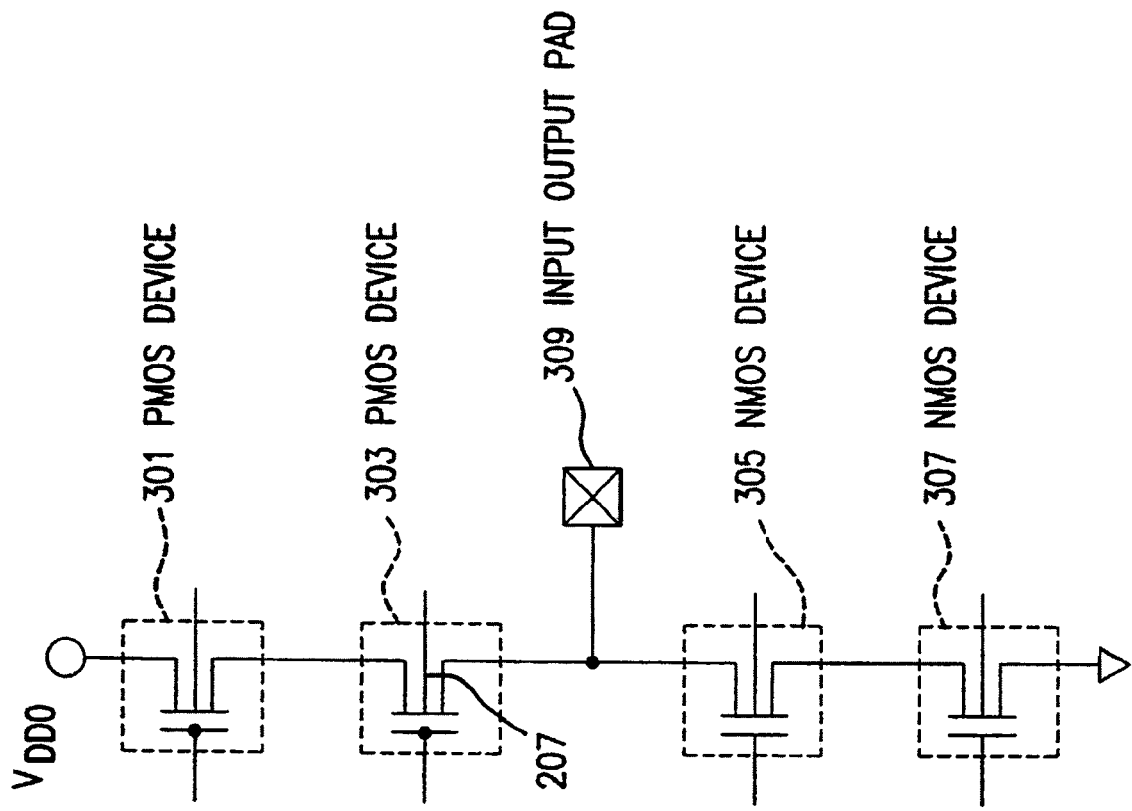
FIG. 3 is a schematic of a portion of a CMOS (Complimentary Metal Oxide Semiconductor) input output circuit in which single push pull output devices, as illustrated in FIG. 2, have been replaced by two devices each.

FIG. 3 is a schematic of a portion of a MOS (Metal Oxide Semiconductor) input output circuit in which each push pull output device illustrated in FIG. 2 has been replaced by two devices. That is output device 215 has been replaced by devices 301 and 303 and device 217 has been replaced by devices 305 and 307. By replacing devices 215 and 217 by two devices each, the output voltage appearing at pad 309 may be safely divided over the two upper (301 and 303) and the two lower (305 and 307) I/O devices. The middle NMOS device 303 and the middle PMOS device 305 have their gates biased to intermediate potentials to avoid excessive voltages under various I/O pad, 309, voltages. Thus, devices 301 and 307 serve to drive the signal at the I/O pad 309, while devices 303 and 305 protect devices 301 and 307 by having their gates biased to intermediate voltages.

Figure 4:
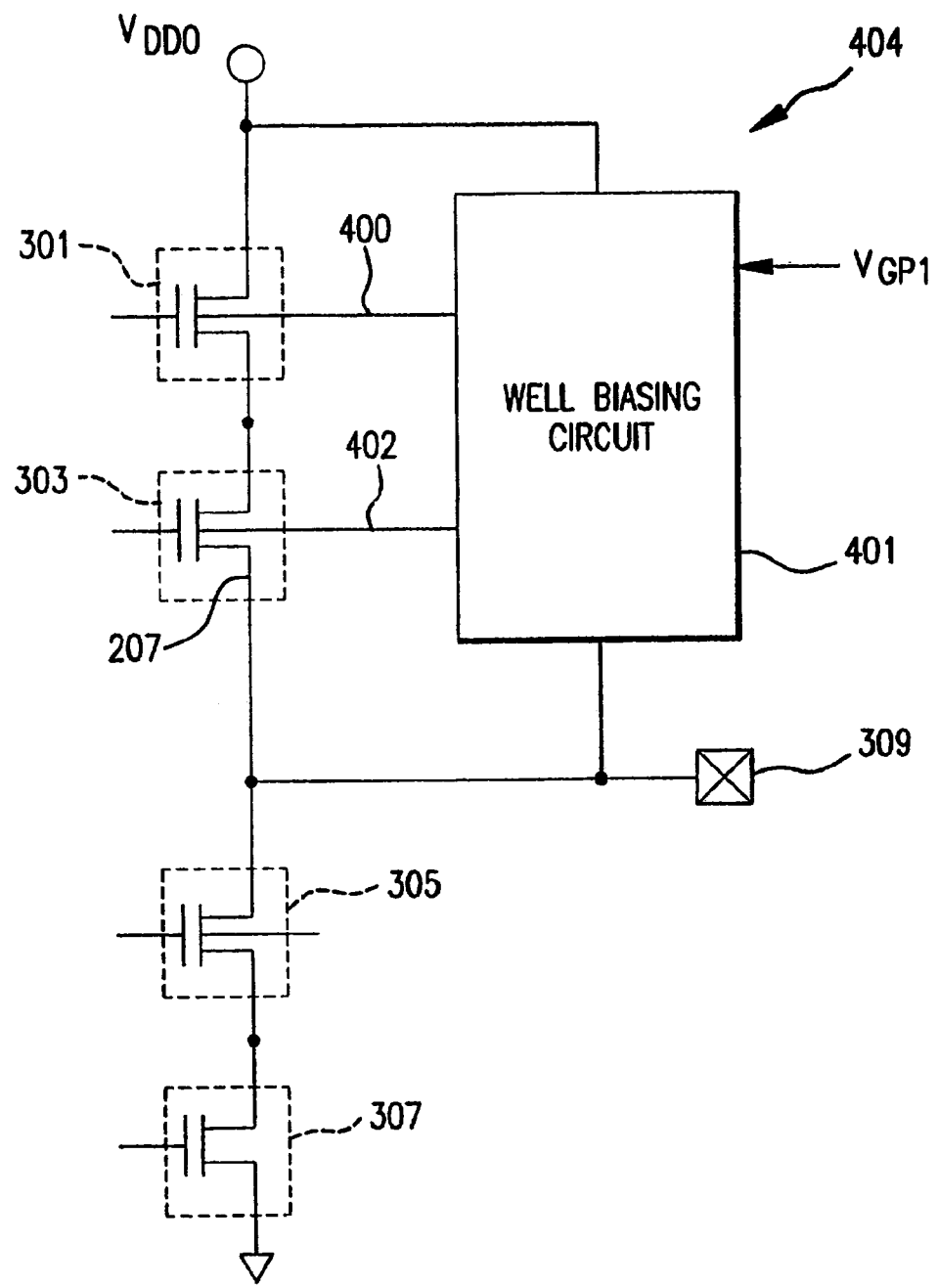
FIG. 4 is an input output circuit, including a well biasing circuit, according to an embodiment of the invention.
Figure 7:
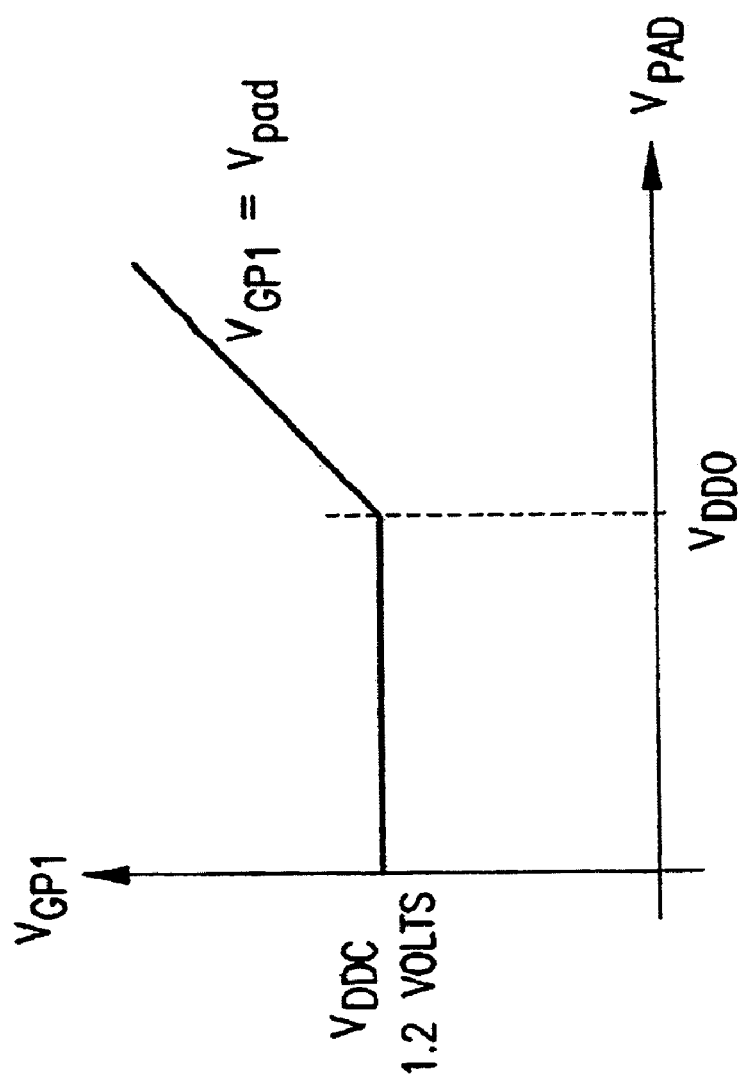
FIG. 7 is a graphical representation of a bias voltage ($V_{GP1}$) as a function of I/O pad voltage ($V_{PAD}$), according to an embodiment of the invention.

FIG. 4 is an input output circuit 404, including a well biasing circuit, according to an embodiment of the invention. Devices 301 and 303 are fabricated in wells, illustrated schematically as 400 and 402, which are essentially at a floating potential. Because devices in wells at floating potential can have problems, such as device latch up, wells may commonly be coupled to a known bias voltage. The wells of devices 301 and 303 are coupled to the highest circuit potential available using well biasing circuit 401. The inputs to the well biasing circuit are the pad voltage present on input output pad 309, voltage $V_{DDO}$ and bias voltage $V_{GP1}$ which are illustrated in FIG. 7.

During the operation of input output circuit 404 in an output mode (when pad 309 is in an output driving mode), wells 400 and 402 are coupled to voltage $V_{DDO}$. When the pad 309 is in an input mode, the well voltage depends upon the I/O pad voltage. In the output enable mode $V_{Well}=V_{DDO}$.

When input output circuit 404 is in an input mode (when pad 309 is in an input mode), $V_{well}$ depends on both the input (Pad) voltage $V_{PAD}$ and $V_{DDO}$. If $V_{PAD}$ is less than $V_{DDO}$ when the input output circuit 404 is in the input mode, then $V_{well}=V_{DDO}$. If $V_{PAD}$ is greater than $V_{DDO}$ then $V_{well}=V_{PAD}$. A graph of this relationship is illustrated in FIG. 5.

Figure 5:
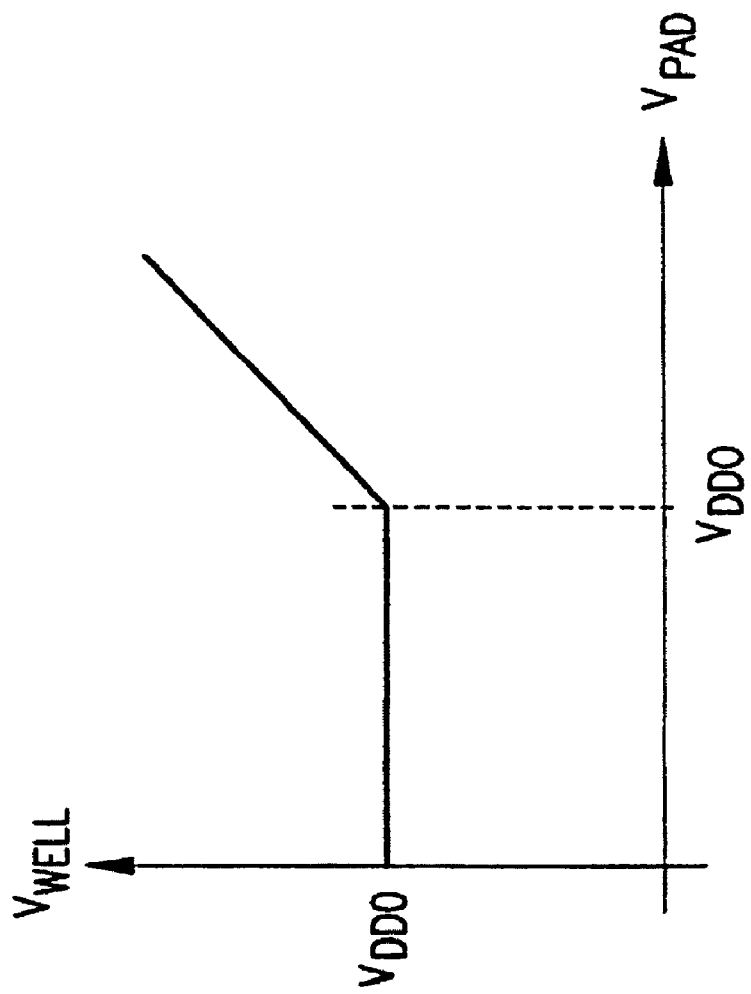
FIG. 5 is a graph illustrating the relationship between well voltage and I/O pad voltage for the input (or a tristate) mode, according to an embodiment of the invention.

FIG. 5 is a graph illustrating the relationship between well voltage and pad voltage for the I/O circuit in an input (or a tristate) condition. As can be seen from the graph, if the pad voltage is less than $V_{DDO}$, then the well voltage is equal to $V_{DDO}$. If the pad voltage is greater than $V_{DDO}$, then the well voltage is equal to the pad voltage. The well bias can thereby be changed according to changing circuit conditions.

Figure 6:
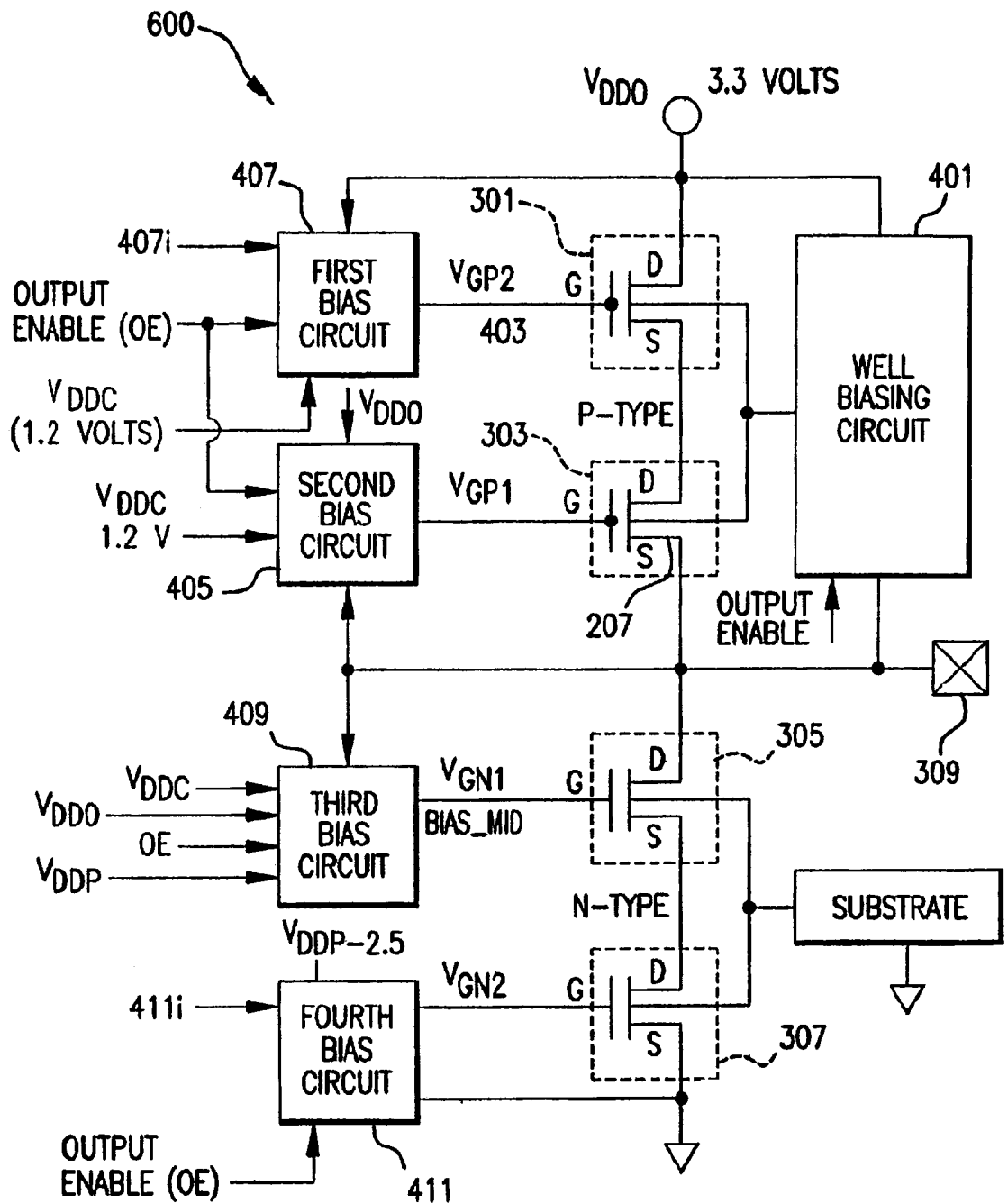
FIG. 6 is a block diagram of I/O circuitry biasing according to an embodiment of the invention.

FIG. 6 is a block diagram of I/O circuitry 600 biasing according to an embodiment of the invention. When I/O circuitry 600 is in the input mode, first bias circuit 407 ties gate 403 of device 301 to $V_{DDO}$. In the output mode device 301 is controlled by an input from first bias circuit 407 according to whether a high or low value is the desired output on the pad 309.

In the input mode second bias circuit 405 provides gate voltage $V_{GP1}$ to the gate of output device 303. The gate voltage $V_{GP1}$ provided to the gate of output device 303 varies from an intermediate power supply voltage, such as $V_{DDC}$ being equal to 1.2 volts, and the pad voltage presented to the circuit at input output pad 309. Such biasing prevents device 303 from being damaged due to a voltage potential across its junctions larger than the allowed maximum voltage of the device.

FIG. 7 is a graphical representation of $V_{GP1}$ bias voltage as a function of pad voltage ($V_{PAD}$). If $V_{PAD}$ is less than $V_{DDO}$, then $V_{GP1}$ provided to the gate of output device 303 is equal to the intermediate supply voltage $V_{DDC}$. If $V_{PAD}$ is greater than $V_{DDO}$ then $V_{GP1}$ provided to the gate of output device 303 is equal to $V_{PAD}$. In such a manner the voltage between the gate of device 303 and pad 309 can be kept in a safe range to prevent damage to the junction.

To summarize the operation of the circuit of FIG. 6, when the circuit 600 is in an output mode, the well biasing circuit 401 ties the wells of devices 301 and 303 to $V_{DDO}$. The gate of the lower PMOS device 307 is tied to an intermediate voltage, such as $V_{DDC}=1.2$ Volts. The gate of upper NMOS device 305 is tied to an intermediate voltage, such as $V_{DDP}=2.5$ Volts.

When the circuit 600 is in not in output mode, that is in the tri-state or input mode then upper PMOS device 301 and lower NMOS device 307 are turned off and the gates of devices 303 and 305 are driven to voltages which will not damage the circuit while the pad 309 is being driven by an external bus.

The gate voltage of the upper NMOS device 305 is controlled by third bias circuit 409. Third bias circuit 409, when in an input or tristate mode, will increase the bias voltage when the pad voltage increases beyond a certain threshold, for example $V_{DDP}$ equal to 2.5 Volts.

Fourth bias circuit 411 works in a similar fashion to first bias circuit 407. Both bias circuits 407 and 411 work in a digital mode, either providing a first or second voltage depending on the required I/O pad 309 output voltage. In a first mode of operation first bias circuit 407 switches between a first voltage $V_{DDO}$ and a second lower voltage $V_{DDC}$. Gate bias circuit 411 switches between providing $V_{DDP}$ and ground potential to the gate of device 307.

Figure 8:
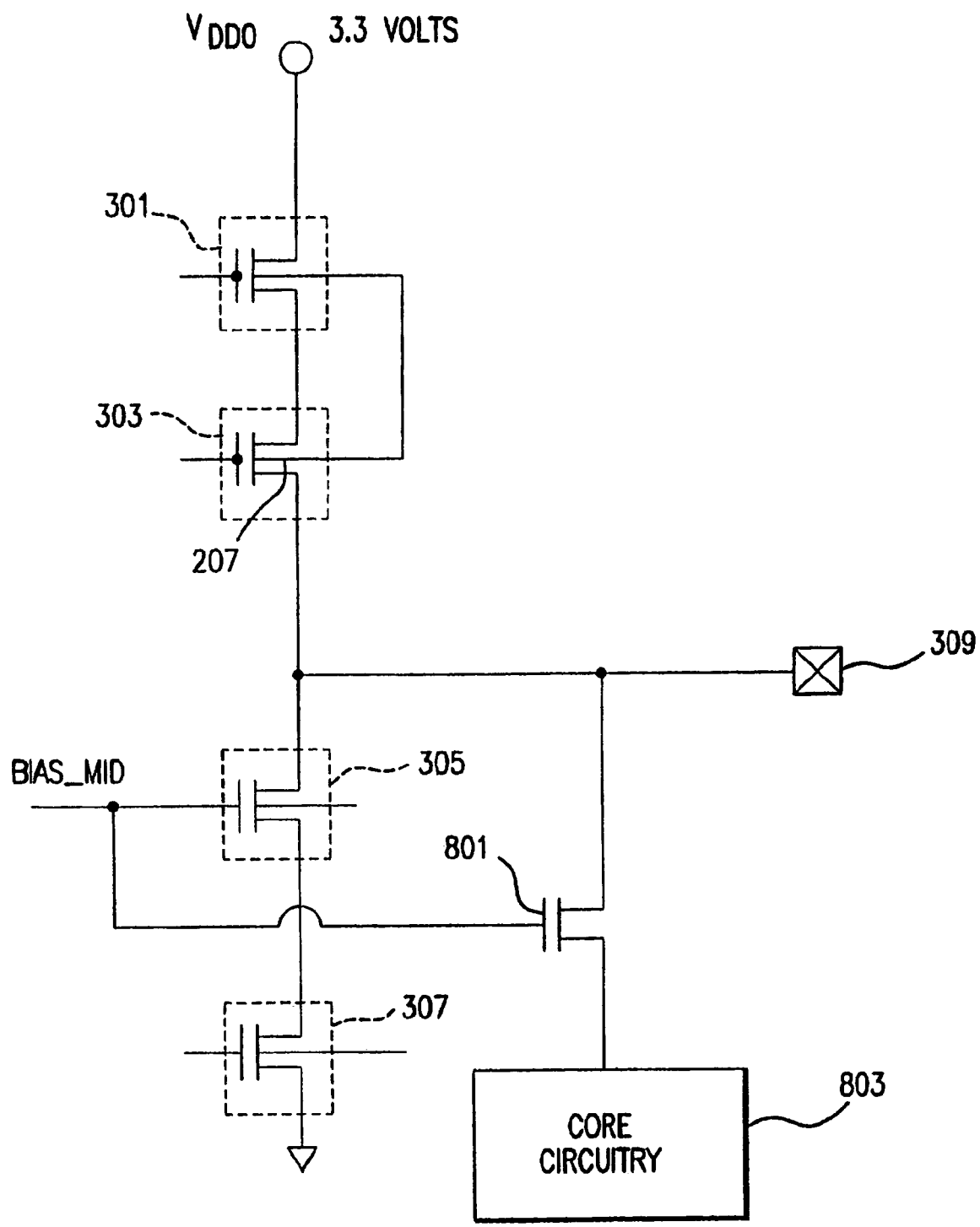
FIG. 8 is a graphical illustration of a portion of a circuit configuration used to provide the I/O pad voltage to the core circuitry, according to an embodiment of the invention.

FIG. 8 is a circuit configuration used to provide the pad voltage to the core circuitry. The $V_{PAD}$ input is coupled to the core circuitry 803 through an NMOS device 801. The gate of NMOS device 801 accepts Bias_Mid as its control voltage. Such an arrangement protects the gate source voltage of device 801 and also prevents large voltages from the input from being coupled into the core circuitry when it is in the input, (tristate) or output conditions.

One facet of the I/O system comprising devices 301, 303, 305 and 307 is that any number of such devices may be added in parallel, in order to provide any level of drive signals needed.

Figure 9A:
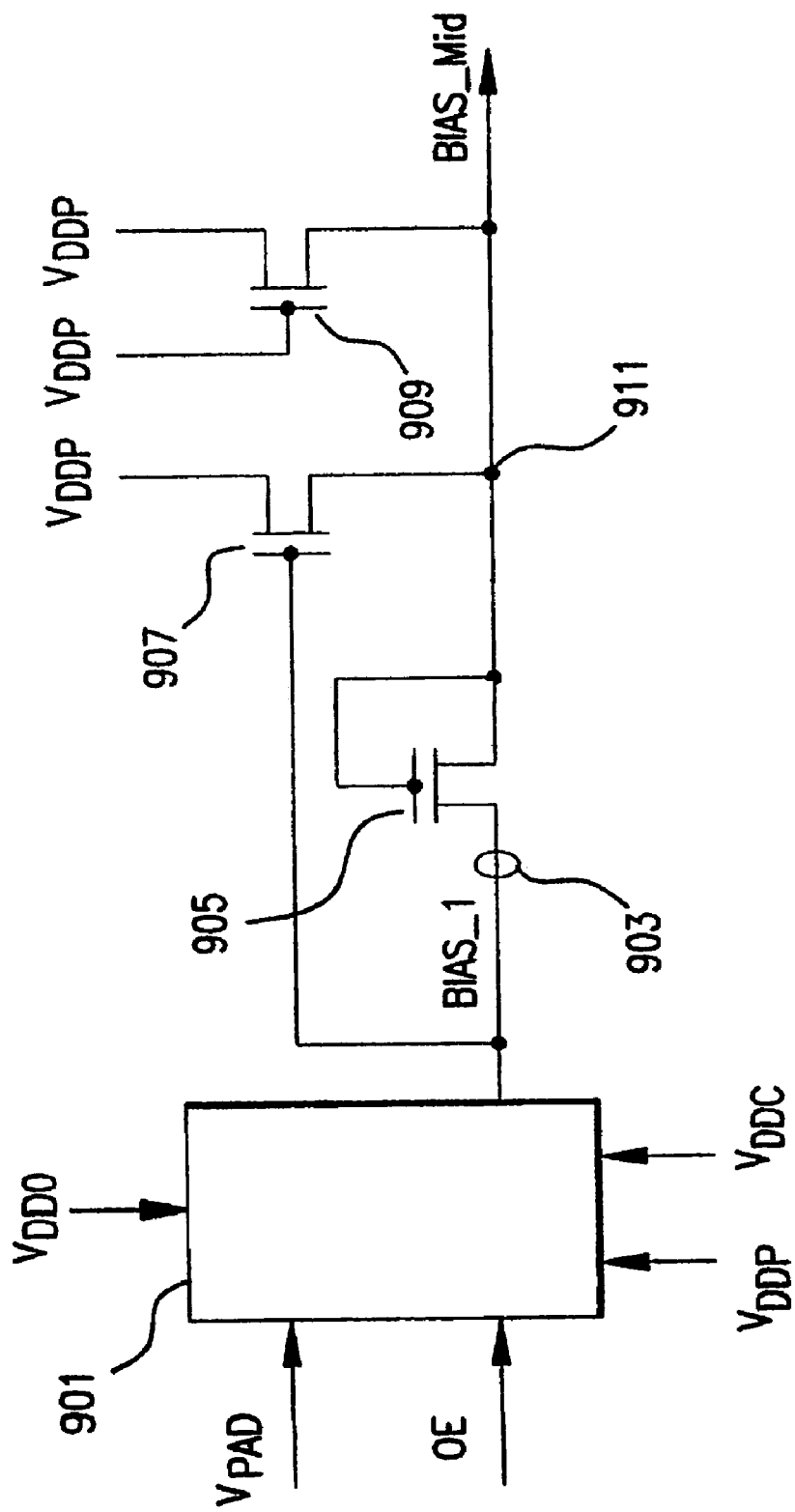
FIG. 9A is a schematic diagram of the generation of Bias_Mid voltage, according to an embodiment of the invention.

FIG. 9A is a schematic diagram illustrating how Bias_Mid voltage is generated. Circuit 901 is a switching circuit that switches its Bias_1 output between voltages $V_{DDO}$ (3.3 Volts nominally in one embodiment) and VDDC (1.2 Volts nominally in one embodiment). Device 905 is a PMOS device as are devices 907 and 909. Device 907 turns on when the output is enabled or the $V_{PAD}$ is low. When device 907 is turned on, Bias_Mid is coupled to $V_{DDP}$. When output is not enabled i.e. the pad is in the tri-state (input only) mode and $V_{PAD}$ is high, then Bias_1 is equal to $V_{DDO}$ and device 905 charges point 911 to Bias_1 minus $V_{TP}$, where $V_{TP}$ is the threshold of device 905, and accordingly is the voltage dropped across device 905. If Bias_Mid is greater than the sum of $V_{DDP}$ and $V_{TP}$, then device 909 will drain current from node 911 such that the sum of $V_{DDP}$ plus $V_{TP}$ is the maximum value for Bias_Mid. Bias_Mid is always between ($V_{DDP}+V_{TP}$) and ($V_{DDO}-V_{TP}$), whether ($V_{DDP}+V_{TP}$) or ($V_{DDO}-V_{TP}$) is larger. A typical value of the threshold voltage $V_{TP}$ is 0.5 volts. The actual value of Bias_Mid will be determined by the relative sizes of devices 907 and 909.

Figure 9B:
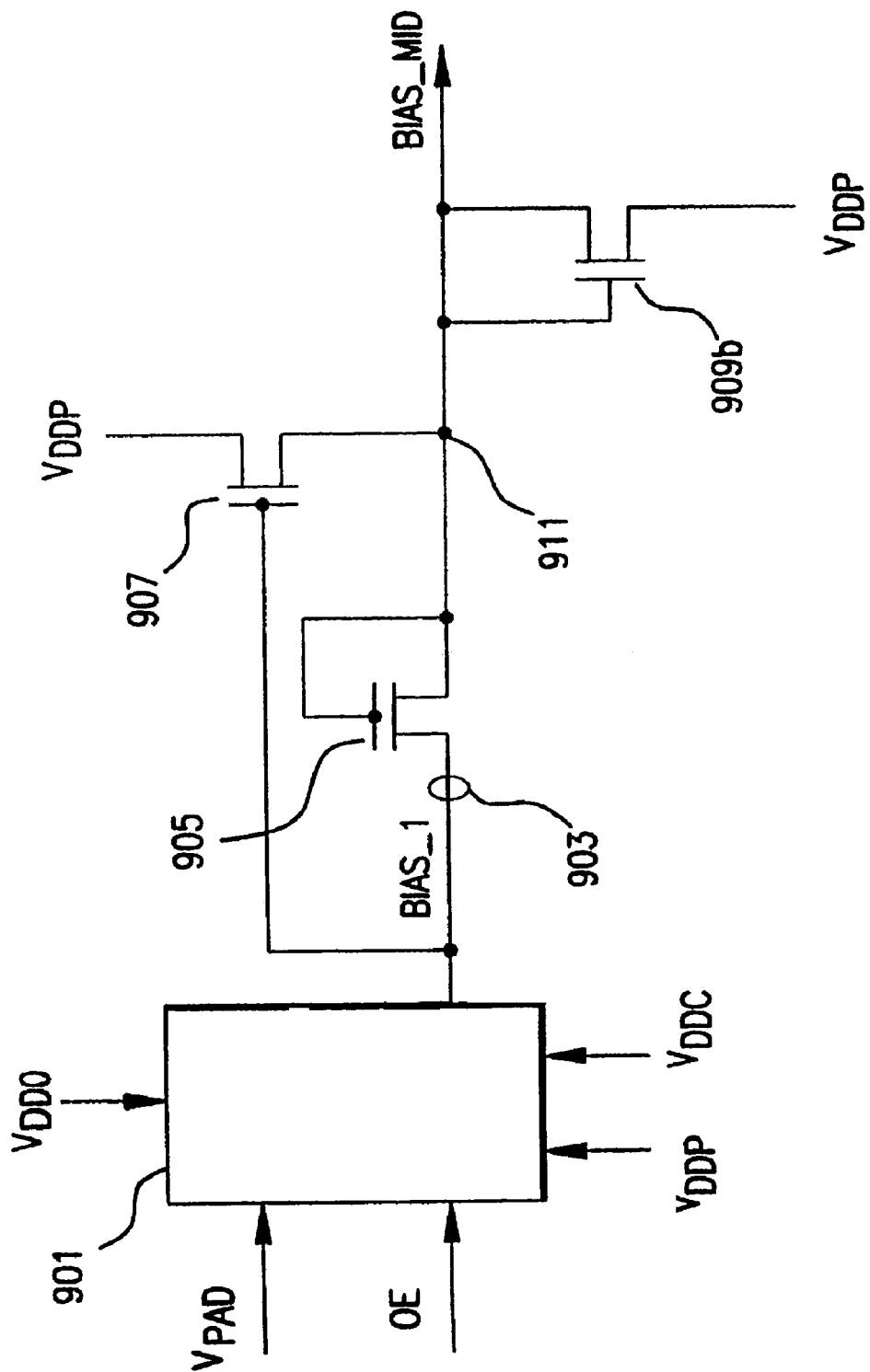
FIG. 9B is a schematic diagram of an alternative embodiment for the generation of Bias_Mid voltage, according to an embodiment of the invention.

FIG. 9B is a schematic diagram of an alternate embodiment illustrating how Bias_Mid voltage is generated in an alternate embodiment. Circuit 901 is a switching circuit that switches its Bias_1 output between voltages $V_{DDO}$ (3.3 Volts nominally in the present embodiment) and $V_{DDC}$ (1.2 Volts nominally in the present embodiment). Device 905 is a PMOS device as is device 907. Device 909B is a NMOS device. Device 907 turns on when the output is enabled or the $V_{PAD}$ is low. When device 907 is turned on, Bias_Mid is coupled to $V_{DDP}$. When output is not enabled i.e. the pad is in the tri-state (input only) mode and during this time when $V_{PAD}$ is high, then Bias_1 is equal to $V_{DDO}$ and device 905 charges point 911 to Bias_1 minus $V_{TP}$, where $V_{TP}$ is the threshold of device 905, and accordingly is the voltage dropped across device 905. If Bias_Mid is greater than the sum of ($V_{DDP}+V_{TP}$) then device 909b will drain current from node 911 such that ($V_{DDP}+V_{TP}$) is the maximum value for Bias_Mid. Bias_Mid is always between ($V_{DDP}+V_{TN}$) and ($V_{DDO}-V_{TP}$), whether ($V_{DDP}+V_{TN}$) or ($V_{DDO}-V_{TP}$) is larger. A typical voltage value for the threshold voltage $V_{TP}$ is 0.5 volts. The actual value of Bias_Mid will be determined by the relative sizes of devices 907 and 909b.

Figure 9C:
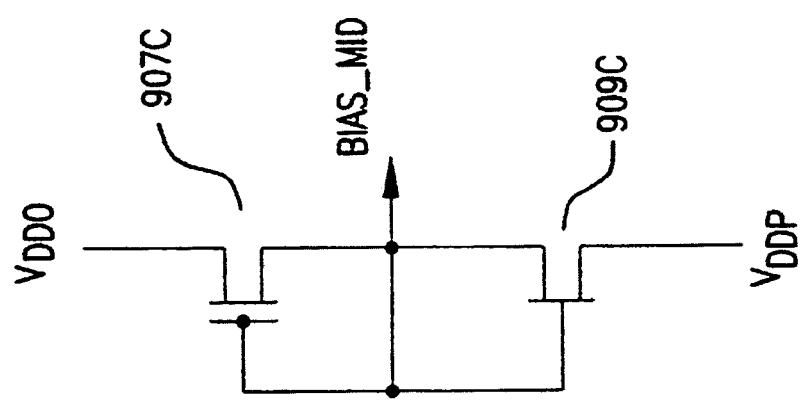
FIG. 9C is a schematic diagram of yet another alternative embodiment for generation of Bias_Mid voltage, according to an embodiment of the invention.

FIG. 9C is a schematic diagram of yet another alternate embodiment for generation of Bias_Mid voltage. In this circuit Bias_Mid is always greater than ($V_{DDP}+V_{TN}$) and less than ($V_{DDO}-V_{TP}$).

Figure 10:
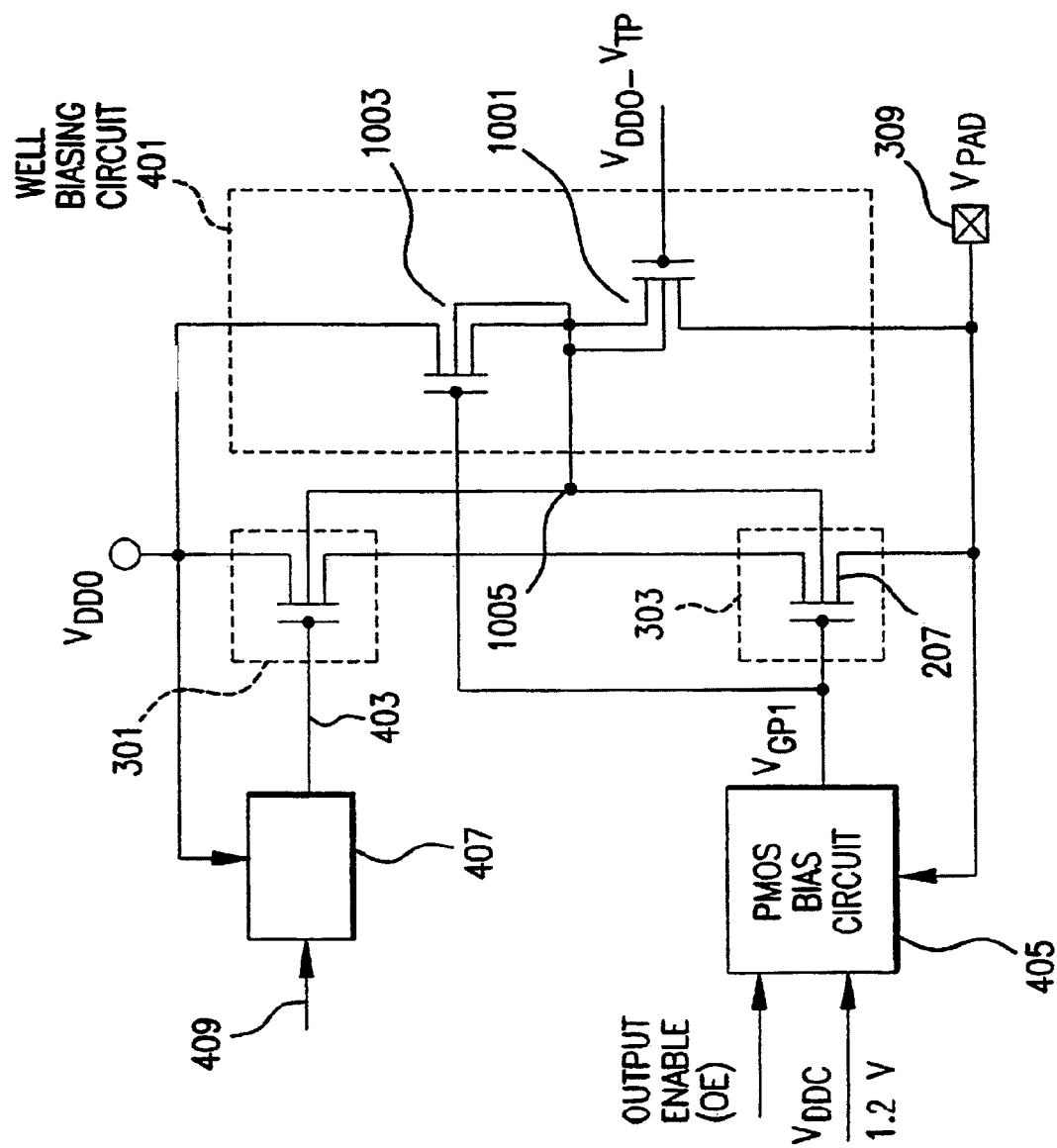
FIG. 10 is a schematic diagram of an exemplary well biasing circuit, according to an embodiment of the invention.

FIG. 10 is a schematic diagram of an exemplary well biasing circuit, according to an embodiment of the invention. Device 1001, when turned on, couples the I/O pad 309 to the well 1005. Device 1003, when turned on, couples $V_{DDO}$ to the well 1005. When $V_{PAD}$ is less than $V_{DDO}$ the gate source of device 1001 is less than the threshold voltage of device 1001, and device 1001 is turned off. When $V_{GP1}$ is low (e.g. 1.2 Volts) then device 1003 conducts, thereby tying the well 1005 to $V_{DDO}$. When $V_{PAD}$ is equal to $V_{DDO}$ or greater then device 1001 will begin to turn on, thereby coupling the well 1005 to $V_{PAD}$.

Figure 11A:
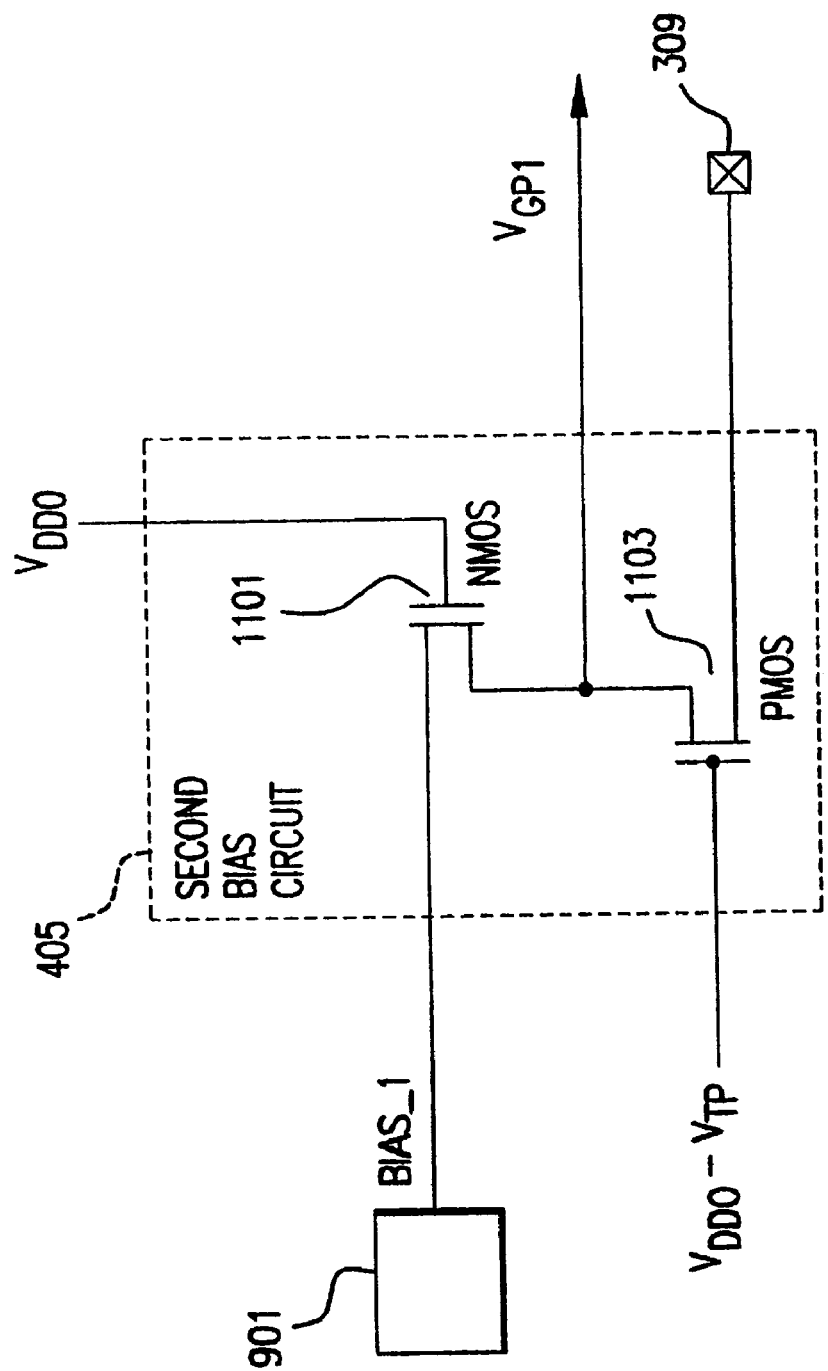
FIG. 11A is a schematic diagram of a circuit used to generate $V_{GP1}$.

FIG. 11A is a schematic diagram of a circuit used to generate $V_{GP1}$. Bias_1 switches between $V_{DDO}$ (3.3 volts) and VDDC (1.2 volts). Device 1101 couples Bias_1 to $V_{GP1}$, When bias_1 is 3.3 volts device 1101 couples 3.3V to $V_{GP1}$, and when bias_1 is 1.2 Volts then, $V_{GP1}$ is tied to 1.2 volts. When the $V_{PAD}$ at 309 is greater than $V_{DDO}$ device 1103 begins to conduct, because the gate of device 1103 is tied to ($V_{DDO}-V_{TP}$), and $V_{GP1}$ is thereby coupled to $V_{PAD}$.

Figure 11B:
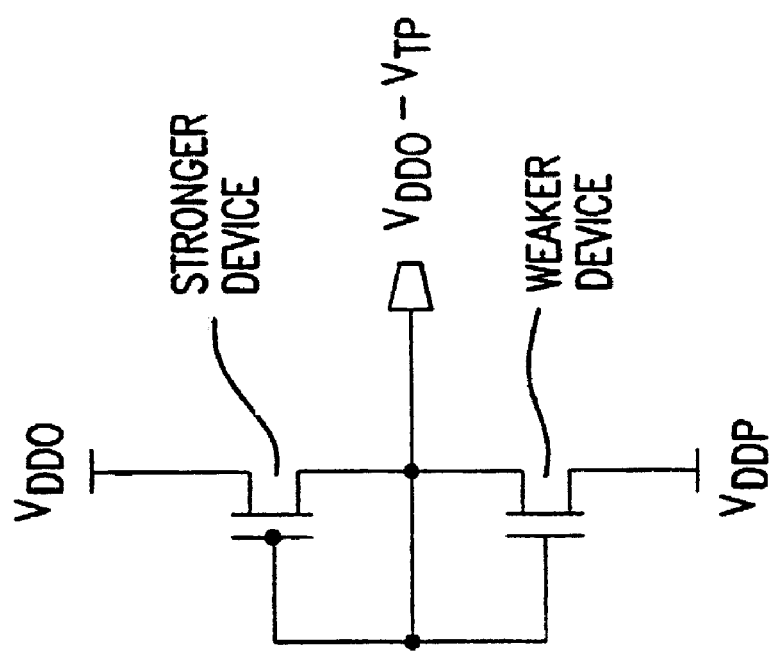
FIG. 11B is a schematic diagram illustration of the generation of $V_{DDO}-V_{TP}$ depicted in FIG. 11A.

FIG. 11B shows a circuit which may be used to generate ($V_{DDO}-V_{TP}$). The strong upper PMOS device charges the node 1150 to ($V_{DDO}-V_{TP}$). In addition to the problems that may be caused when a lower supply voltage chip is interfaced with a higher voltage chip Apower-on stress@ problems, which may be caused when circuitry is turned on and the supplies that provide protective biases are not yet up to their full voltage, may exist. In such a case a voltage present at an I/O pad may stress devices which are coupled to that I/O pad.

Figure 11C:
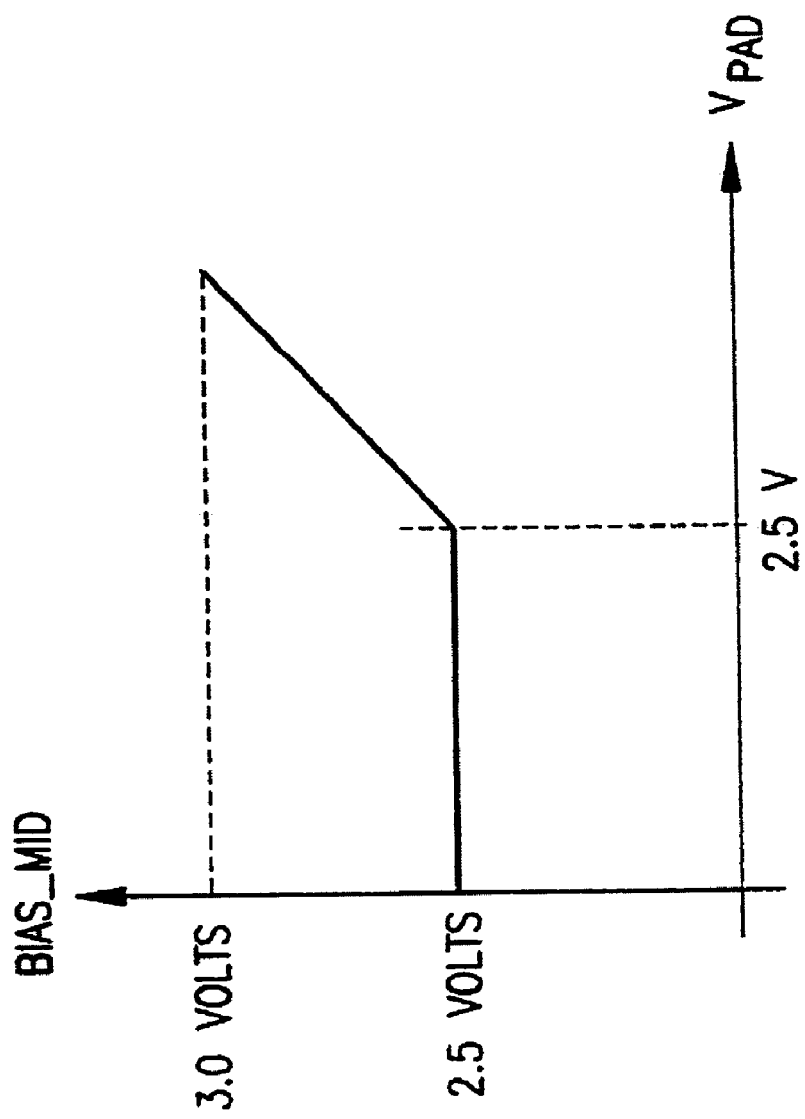
FIG. 11C is a graph illustrating the relationship between Bias_Mid and $V_{PAD}$ according to an embodiment of the invention.

FIG. 11C is a graph illustrating the relationship between Bias_Mid and $V_{PAD}$. Bias_Mid is set at 2.5 volts, and remains at 2.5 volts until $V_{PAD}$ increases beyond 2.5 volts. Thereafter Bias_Mid tracks increases with $V_{PAD}$ and becomes equal to a higher voltage when $V_{PAD}$ increases beyond a certain value.

Figure 11D:
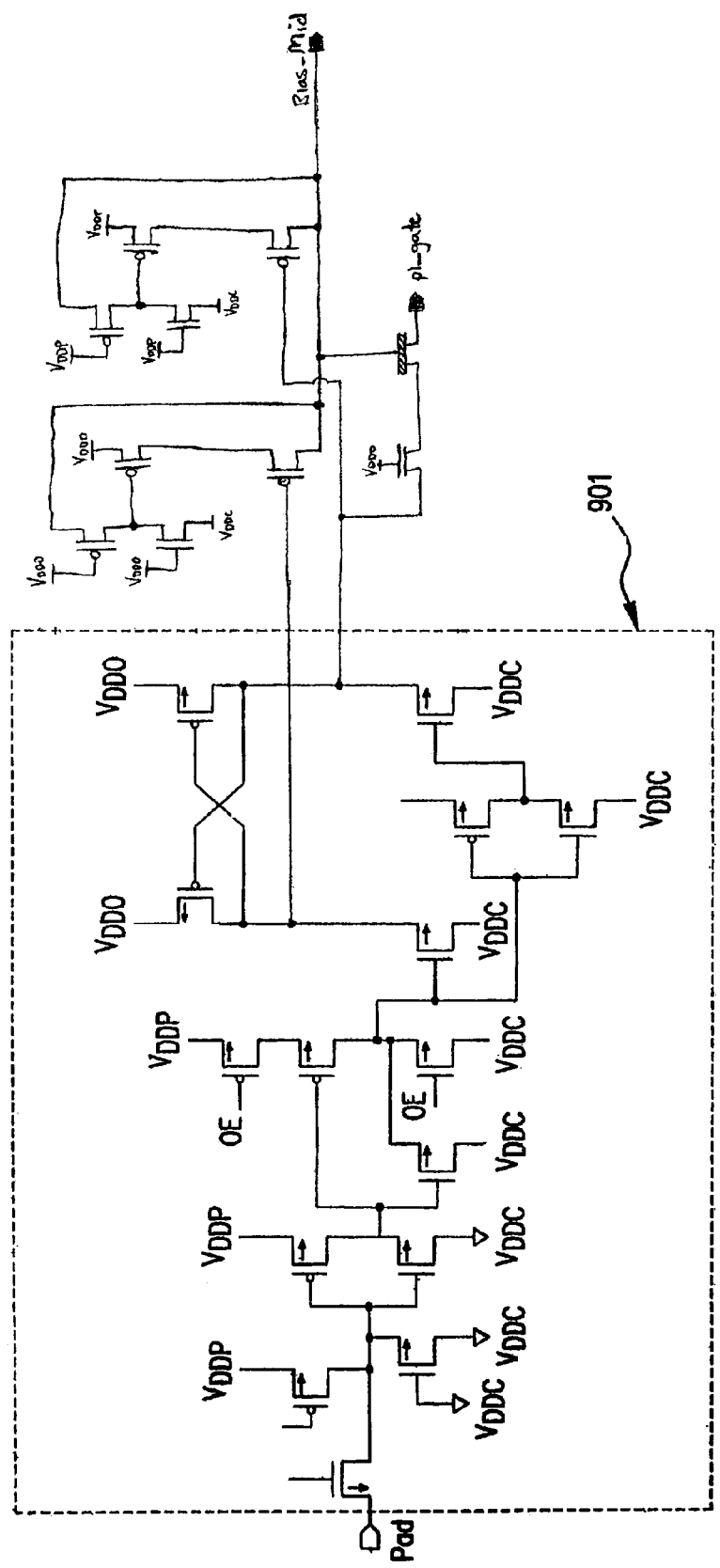
FIG. 11D is a schematic diagram depicting an exemplary illustration of a transistor implementation of block 901.

FIG. 11D is a schematic diagram depicting an exemplary illustration of a transistor implementation of circuit 901.

Figure 12:
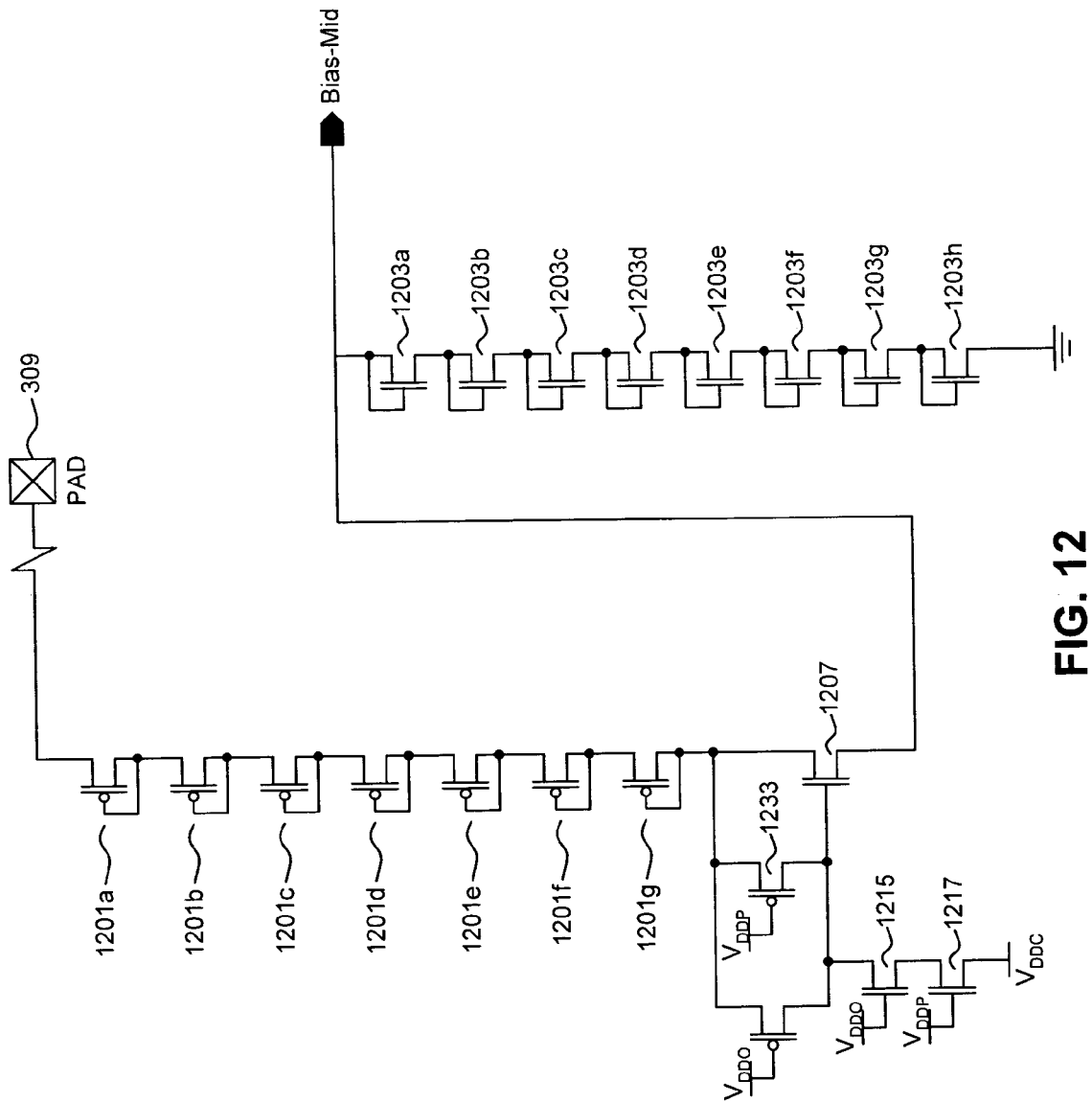
FIG. 12 is a schematic diagram of a circuit that may be used to prevent power on stress of devices, according to an embodiment of the invention.

FIG. 12 is a schematic diagram of a circuit that may be used to prevent power on stress of devices, according to an embodiment of the invention. The circuit illustrated in FIG. 12 may be used to generate the Bias_Mid voltage when $V_{DDO}$ is not up to its nominal value. If Bias_Mid is present then devices 301, 303, 305 and 307, shown in FIG. 8, will be protected from junction over voltage problems even though the voltages, which ordinarily would be used to generate Bias_Mid as explained in FIG. 9, are not present e.g., in power management mode.

In FIG. 12 devices 1201a–g are arranged as a series of diode coupled PMOS transistors such that a threshold voltage $V_{TP}$ (in the present example equal to approximately 0.5 volts) is dropped across each device when it is conducting. Devices 1203a–h are similarly arranged diode coupled NMOS transistors. A threshold voltage $V_{TN}$ is dropped across 1203a–h if Bias_Mid is high.

Device 1207, in essence, acts as a switch. If $V_{DDO}$ is not present, then device 1215 turns off, device 1221 conducts, and the gate of device 1207 is pulled high. This causes device 1207 to conduct. Similarly, if $V_{DDP}$ is not present, then device 1217 turns off, device 1223 conducts, and the gate of device 1207 is again pulled high. This also causes device 1207 to conduct. When device 1207 is conducting, the pad voltage, minus the threshold voltage of devices 1201a–g, is coupled to Bias_Mid.

If $V_{DDO}$ and $V_{DDP}$ are present, then devices 1215 and 1217 will conduct, and the gate of device 1207 is pulled low to $V_{DDC}$. This causes device 1207 to turn off. As a result, if $V_{DDO}$ or $V_{DDP}$ are not present, as in power management mode, then the circuit depicted in FIG. 12 will supply Bias_Mid using only $V_{PAD}$.

Figure 13:
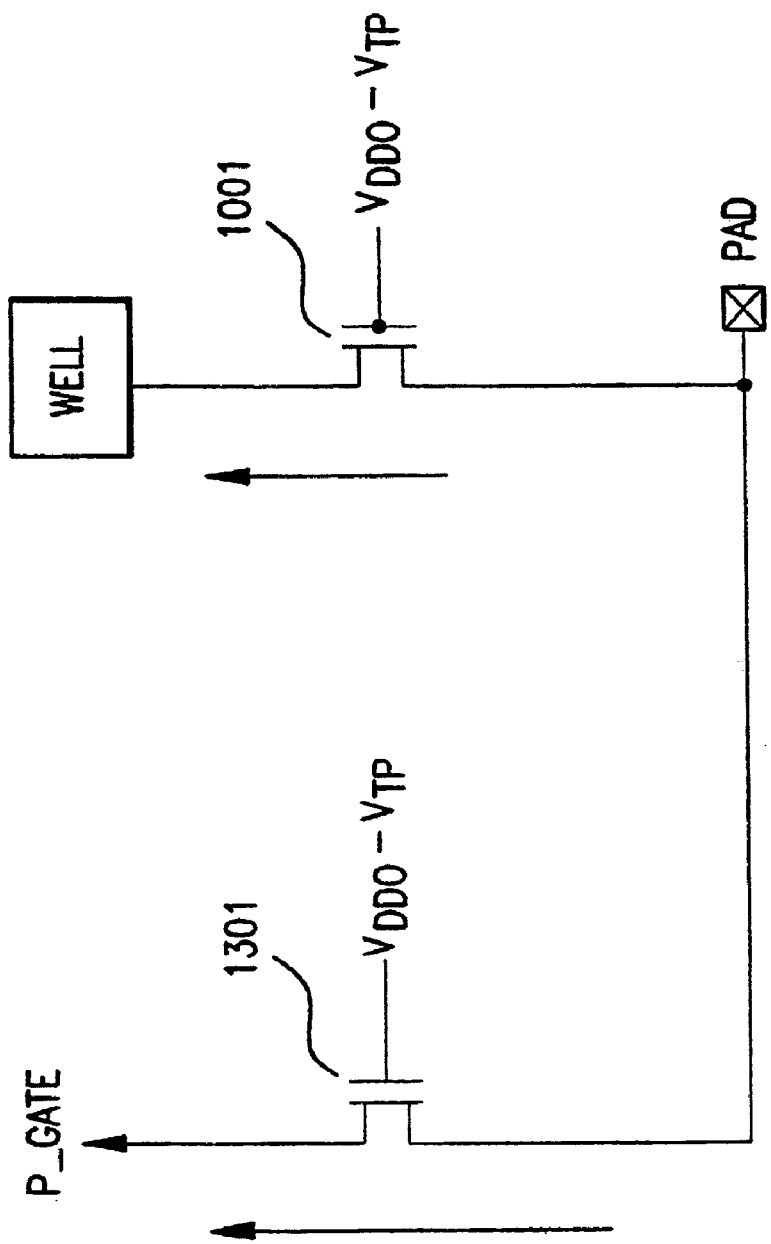
FIG. 13 is a circuit and block diagram of a portion of an over voltage protection circuit.

FIG. 13 is a circuit and block diagram of a portion of an over voltage protection circuit. Device 1001 provides a protection mechanism for the well bias. If the pad voltage is higher than $V_{DDO}$ is lower than by $V_{TP}$ or more, then device 1001 will turn on. If device 1001 turns on then the well is coupled, via device 1001, to the pad, and hence the well will be biased to $V_{PAD}$.

Similarly device 1301 is coupled between the pad and P_Gate, the gate of PMOS device 303 shown in FIG. 6. The gate of device 1301 is biased so that when the pad voltage 309 is higher than $V_{DDO}$ by $V_{TP}$ or more, then device 1301 will turn on and couple P_Gate to the pad voltage, therefore if $V_{DDO}$ is low then P_Gate will not depend on $V_{DDO}$ for it=s voltage level and instead will take the voltage level from the voltage on the pad.

Figure 14:
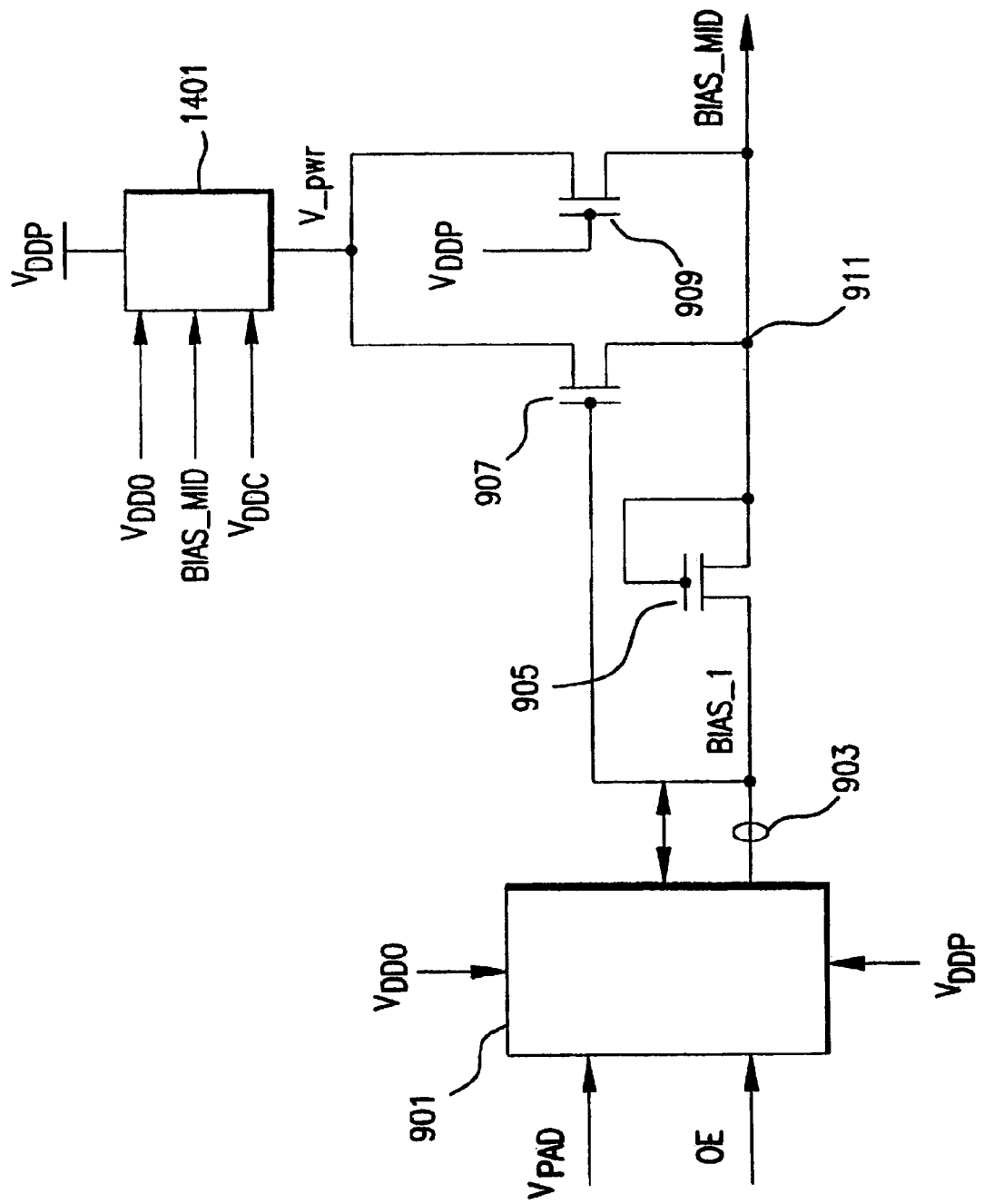
FIG. 14 is a schematic diagram illustrating a modification of FIG. 9A.

FIG. 14 is a schematic diagram illustrating a modification of FIG. 9. In FIG. 14 circuit 901 is decoupled from the Bias_Mid signal when $V_{DDO}$ is lower than its nominal value. The decoupling is done by using circuit 1401. When $V_{DDO}$ is not up to its nominal value, the node V_pwr is decoupled from $V_{DDP}$ by using circuit 1401 as a switch. When $V_{DDO}$ is up to its nominal value, the node V_pwr is coupled to $V_{DDP}$ by using circuit 1401.

Figure 15:
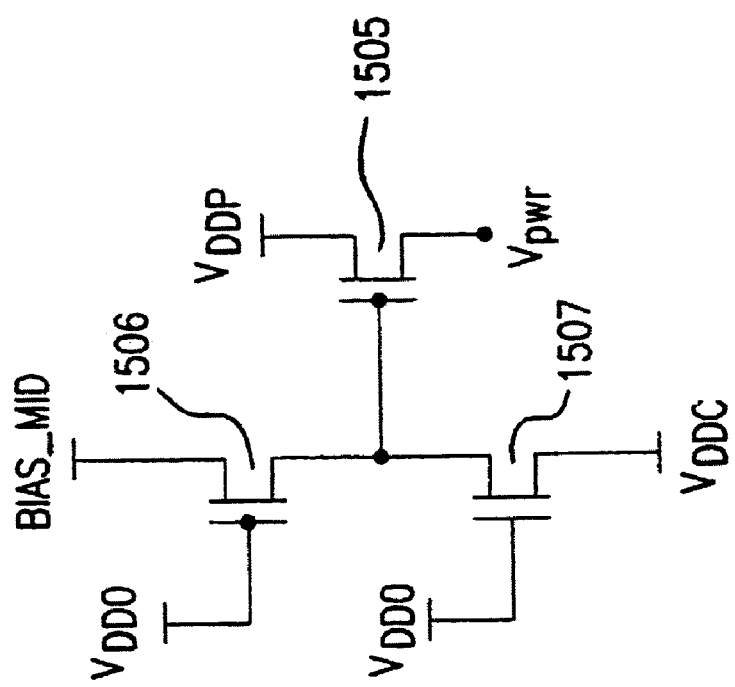
FIG. 15 is a schematic diagram illustrating a transistor implementation of block 1401.

FIG. 15 is a schematic diagram illustrating a transistor implementation of circuit 1401. When $V_{DDO}$ is greater than a certain value, NMOS 1507 is turned on thereby connecting the gate of PMOS 1505 to $V_{DDC}$. Connecting the gate of of PMOS 1505 to $V_{DDC}$ turns on 1505 thereby connecting V_pwr to $V_{DDP}$. When $V_{DDO}$ is less than a certain value, NMOS 1507 is turned off and PMOS 1506 is turned on thereby connecting the gate of PMOS 1505 to Bias_Mid, thereby turning off PMOS 1505 and disconnecting V_pwr from $V_{DDP}$.

Figure 16:
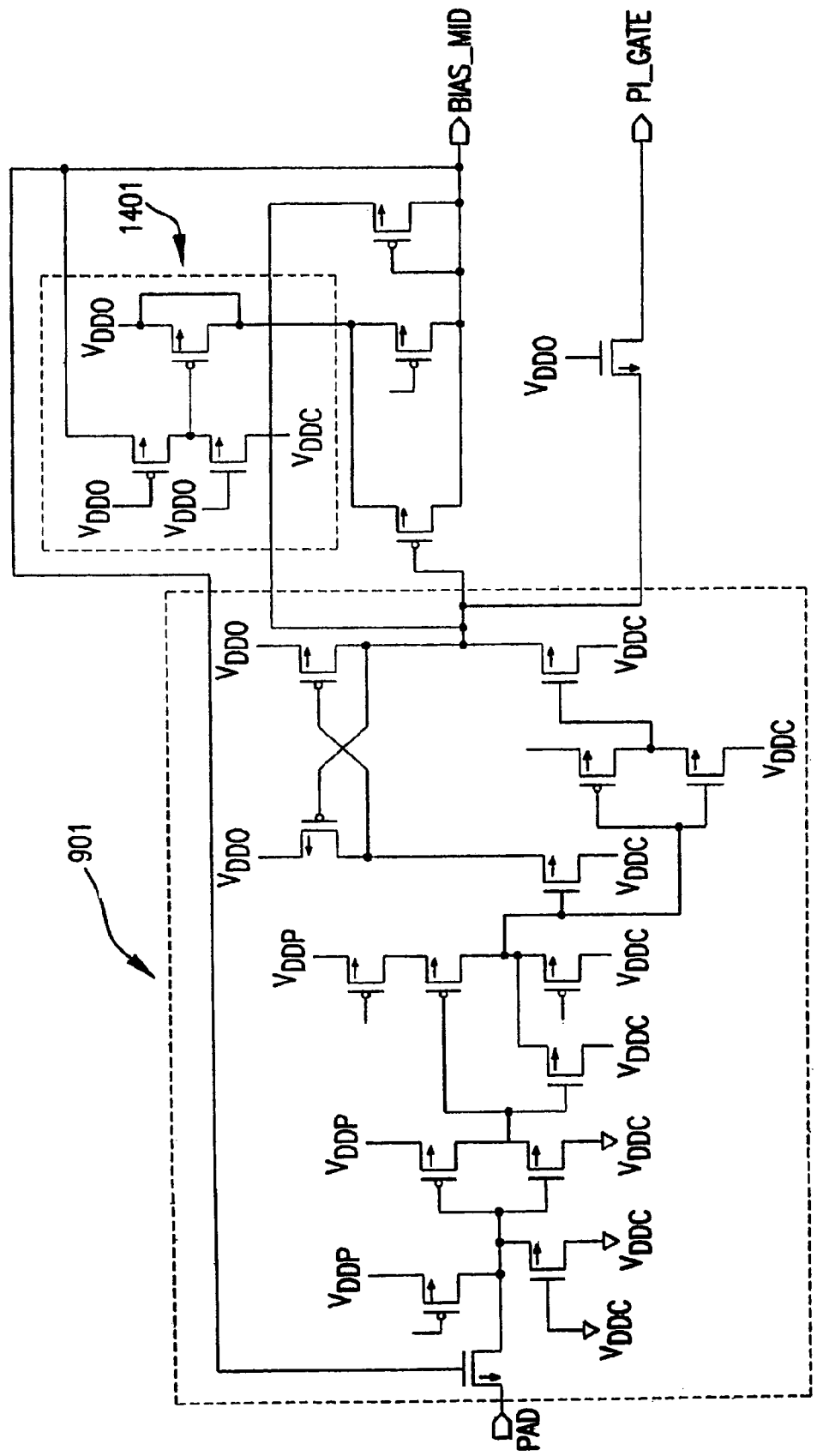
FIG. 16 is a schematic diagram illustrating a transistor implementation of FIG. 14.

FIG. 16 is a schematic diagram illustrating a transistor implementation of the circuitry illustrated in FIG. 14.

Figure 17:
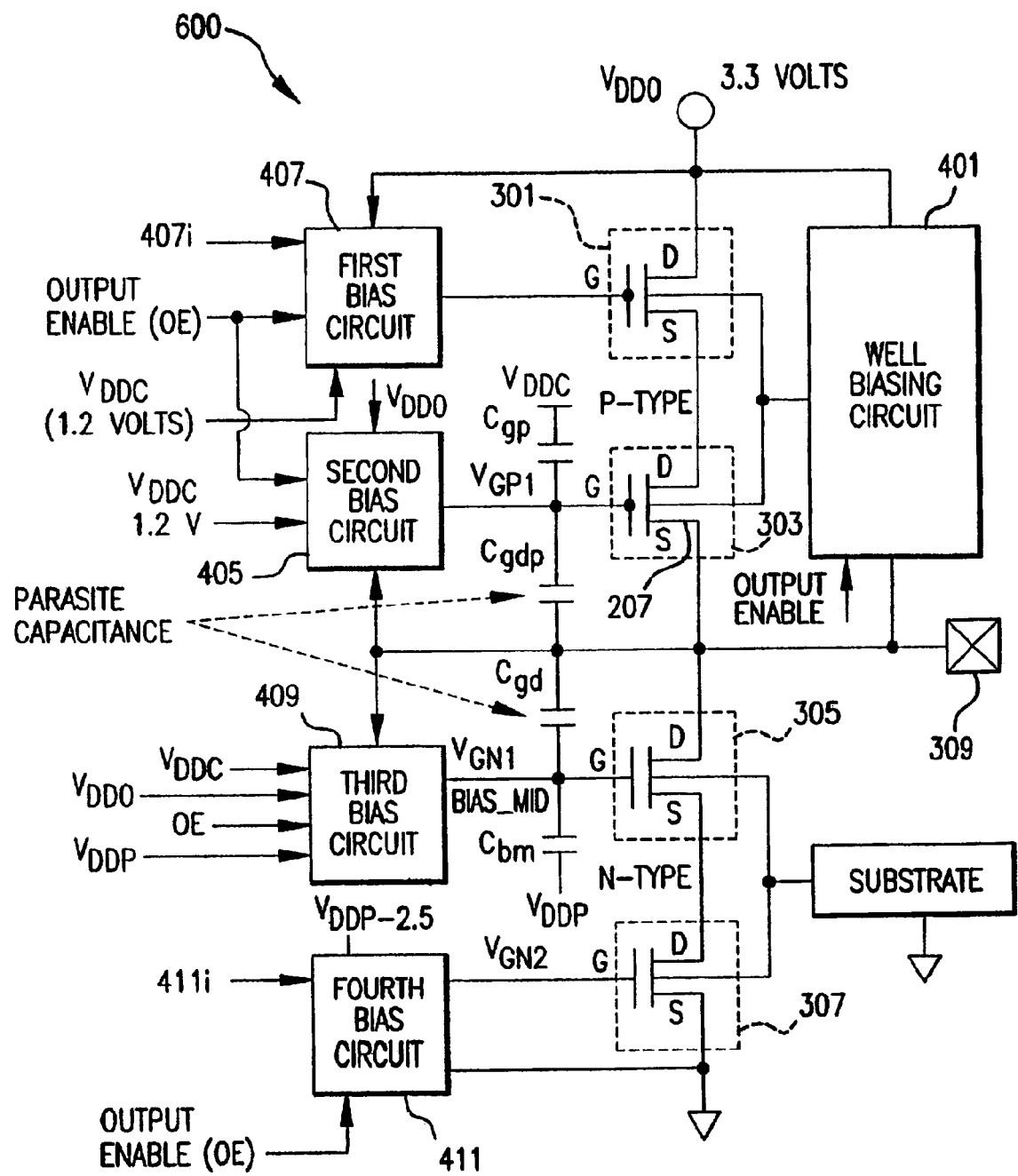
FIG. 17 is a schematic diagram of a circuit that may be used to prevent stress on devices when voltage spikes appear at an I/O pad.

FIG. 17 is a schematic diagram of a circuit that may be used to prevent stress on devices when voltage spikes appear at an I/O pad. When transient voltages appear, the Bias_Mid voltage changes momentarily due to the gate to drain overlap capicitance (Cgd) of the driver NMOS. A capacitance (Cbm) is placed at the bias_mid node such that the transient voltage at the pad (V_pad,transient) gets divided between Cgd and Cbm depending on the ratio of the capacitances which gives the additional transient voltage on bias_mid(V_bm,transient):

♠ V_bm,transient=(Cgd/(Cgd+Cbm))* ♠ V_pad,transient.

Also, when transient voltages appear, the voltage $V_{GP1}$ on PMOS 207 gate changes momentarily due to the gate to drain overlap capicitance (Cgdp) of the driver PMOS. A capacitance (Cgp) is placed at the PMOS 207 gate node such that the transient voltage at the pad (V_pad,transient) gets divided between Cgdp and Cgp depending on the ratio of the capacitances which gives the additional transient voltage on PMOS 207 gate ($V_{GP1+}$transient):

♠ ($V_{GP1+}$transient)=(Cgdp/(Cgdp+Cgp))* ♠ (V_pad,transient).

Figure 18:
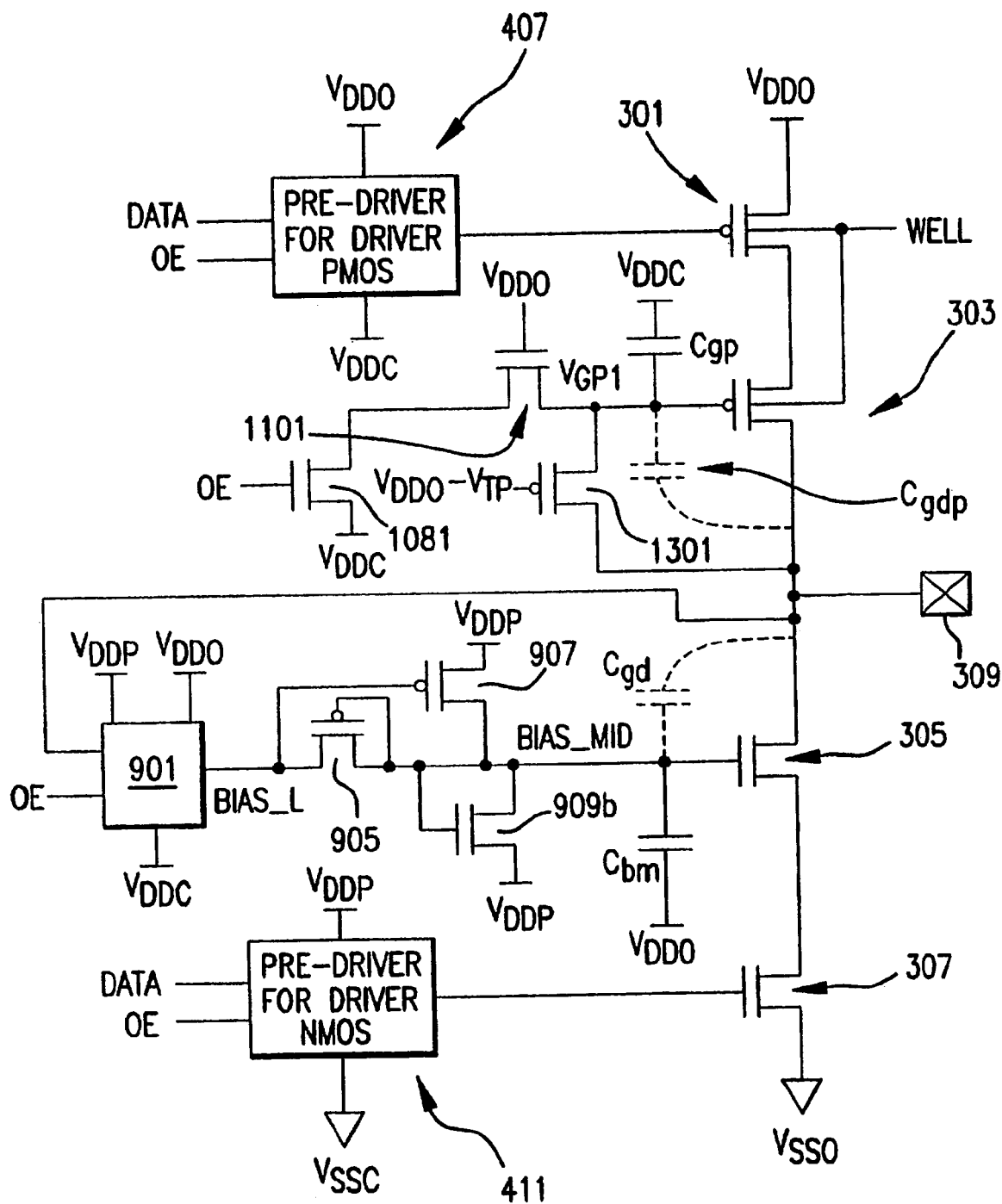
FIG. 18 is a schematic diagram of a circuit including several previously illustrated embodiments of the invention.

FIG. 18 is a schematic diagram of a circuit including several previously illustrated embodiments of the invention. The transistors illustrated in FIG. 18 are all 2.5 volt devices. The maximum output pad voltage is 3.6 volts and the maximum input voltage on $V_{PAD}$ 309 is 5.5 volts. The typical values of power supplies are $V_{DDO}$=3.3 volts, $V_{DDP}$=2.5 volts, $V_{DDC}$=1.2 volts, $V_{SSC}$=0 volts and $V_{SSO}$=0 volts. The operation of the circuit of FIG. 18 under various operating conditions is summarized below.

When the I/O pad 309 is in an output enabled mode (i.e. OE is high) the maximum pad voltage is $V_{DDO}$. $V_{GP1}$ at the gate of PMOS device 303 is coupled to $V_{DDC}$ through NMOS transistors 1101 and 1801 and accordingly PMOS device 303 is turned on. Circuit 901 generates an output Bias_1 voltage of $V_{DDC}$ and accordingly PMOS device 907 is turned on, the steady state voltage of Bias_Mid is $V_{DDP}$ and PMOS device 905 is turned off.

When the I/O pad 309 is output disabled (i.e. OE is low) and the pad voltage is below a predetermined value, then $V_{GP1}$ at the gate of PMOS 303 is floating if the pad voltage is below $V_{DDO}$. Circuit 901 generates a output Bias_1 voltage of $V_{DDC}$ and accordingly PMOS device 907 is turned on, the steady value of Bias_Mid voltage is $V_{DDP}$, and PMOS device 905 is turned-off in this condition.

When the I/O pad 309 is output disabled (i.e. OE is low) and the pad voltage is above a predetermined value, then circuit 901 generates an output Bias_1 voltage of $V_{DDO}$ and accordingly PMOS device 907 is turned-off, PMOS device 905 is is turned on, and the steady state value of Bias_Mid is between ($V_{DDO}-V_{TP}$) as a minimum value and ($V_{DDP}+V_{TN}$) as a maximum value, where $V_{TP}$ and $V_{TN}$ are offset voltages due to the turn on threshold voltages of transistors 905 and 909b respectively. $V_{GP1}$, at the gate of PMOS device 303 is coupled to the pad voltage if the pad voltage is greater than $V_{DDO}$.

Capacitors $C_{bm}$ and $C_{gp}$ in FIG. 18 are used to insure that Bias_Mid voltage and $V_{GP1}$ voltage, respectively, are kept at desirable levels when transient voltages appear at the pad as was described relative to FIG. 17.

Figure 19:
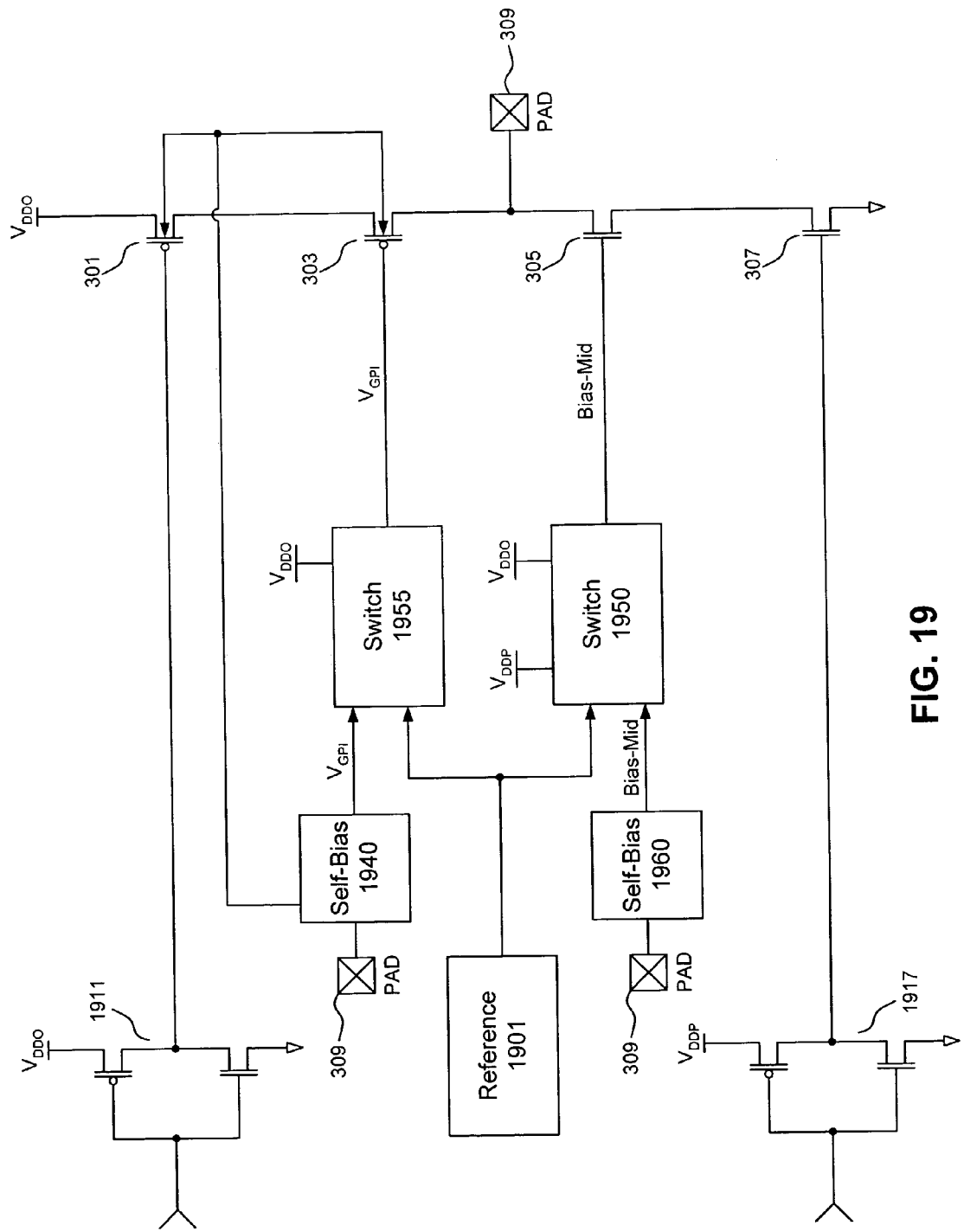
FIG. 19 is a schematic diagram of a circuit that provides proper biasing of the I/O circuit when in power management mode, i.e, when one or more of the power supply voltages are powered off.

FIG. 19 is a schematic diagram of a circuit that provides proper biasing of protective devices 303 and 305 regardless of whether the circuit is in power management mode, or in a normal mode of operation. In power management mode, one or more of the plurality of power supplies (e.g., $V_{DDO}$, $V_{DDP}$ and $V_{DDC}$) are powered off.

As explained above, devices 301 and 303 represent the pull-up section of the I/O circuit, while devices 305 and 307 represent the pull-down section. Devices 301 and 307 are the signal driving devices, while devices 303 and 305 are the protective devices, which are biased to intermediate voltages to protect the I/O circuit from high transient voltages that could damage the I/O circuit. Circuits 1911 and 1917 represent the pre-drivers for devices 301 and 307 respectively.

In an exemplary embodiment, and as noted above, the plurality of power supplies have the following nominal values: $V_{DDO}$=3.3 volts, $V_{DDP}$=2.5 volts, $V_{DDC}$=1.2 volts, $V_{SSC}$=0 volts and $V_{SSO}$=0 volts. These supply voltages and the associated circuitry described above, are used to bias protective devices 303 and 305. As described above, Bias_Mid is the bias voltage applied to protective NMOS device 305, while $V_{GP1}$ is the bias voltage applied to protective PMOS device 303. When one or more of the supply voltages are off, (e.g., when circuit is in power management mode) the present invention ensures that protective devices 303 and 305 are properly biased to maintain tolerable voltage stress across the gate oxides and junctions and to keep the leakage current substantially below 1 µA. Proper biasing is accomplished using the I/O pad voltage 309 to generate Bias_Mid and $V_{GP1}$. This method and circuit for normal operation and power management mode are described below.

In normal mode, reference circuit 1901 is an alternate transistor implementation of circuit 901. Reference circuit 1901 provides a reference input to switch 1950 for generation of bias voltage Bias_Mid during normal operation in input and output modes. Depending on the reference voltage from circuit 1901, Bias_Mid toggles between $V_{DDO}$ and $V_{DDP}$. Reference circuit 1901 also provides bias voltage $V_{GP1}$ (i.e., the gate of protective device 303) via switch 1955 as long as $V_{DDO}$ is present. As is explained in more detail below, as long as supply voltages $V_{DDO}$, $V_{DDP}$ and $V_{DDC}$ are present, reference bias circuit 1901, in combination with switches 1950 and 1955, generate bias voltages Bias_Mid and $V_{GP1}$ to properly bias protective devices 305 and 303 respectively.

In power management mode, where one or more power supply voltages are not present, an alternate method of biasing protective devices 303 and 305 is needed. An alternate biasing scheme is provided by self-bias circuits 1960 and 1940, which generate bias voltages Bias_Mid and $V_{GP1}$ using only the voltage present at the pad 309. Accordingly, when one or more supply voltages are off (e.g., in power management mode), switches 1950 and 1955 essentially de-coupled bias circuit 1901 from self-bias circuits 1960 and 1940. As described below, self-bias circuit 1960 is used to generate Bias_Mid with only the I/O pad voltage ($V_{PAD}$) 309. As also described below, self-bias circuit 1940 receives Bias_Mid and generates $V_{GP1}$ in power management mode. Self-bias circuit 1940 also provides the bias for the floating well for devices 301 and 303 in all modes of operation, including power management mode.

Figure 20:
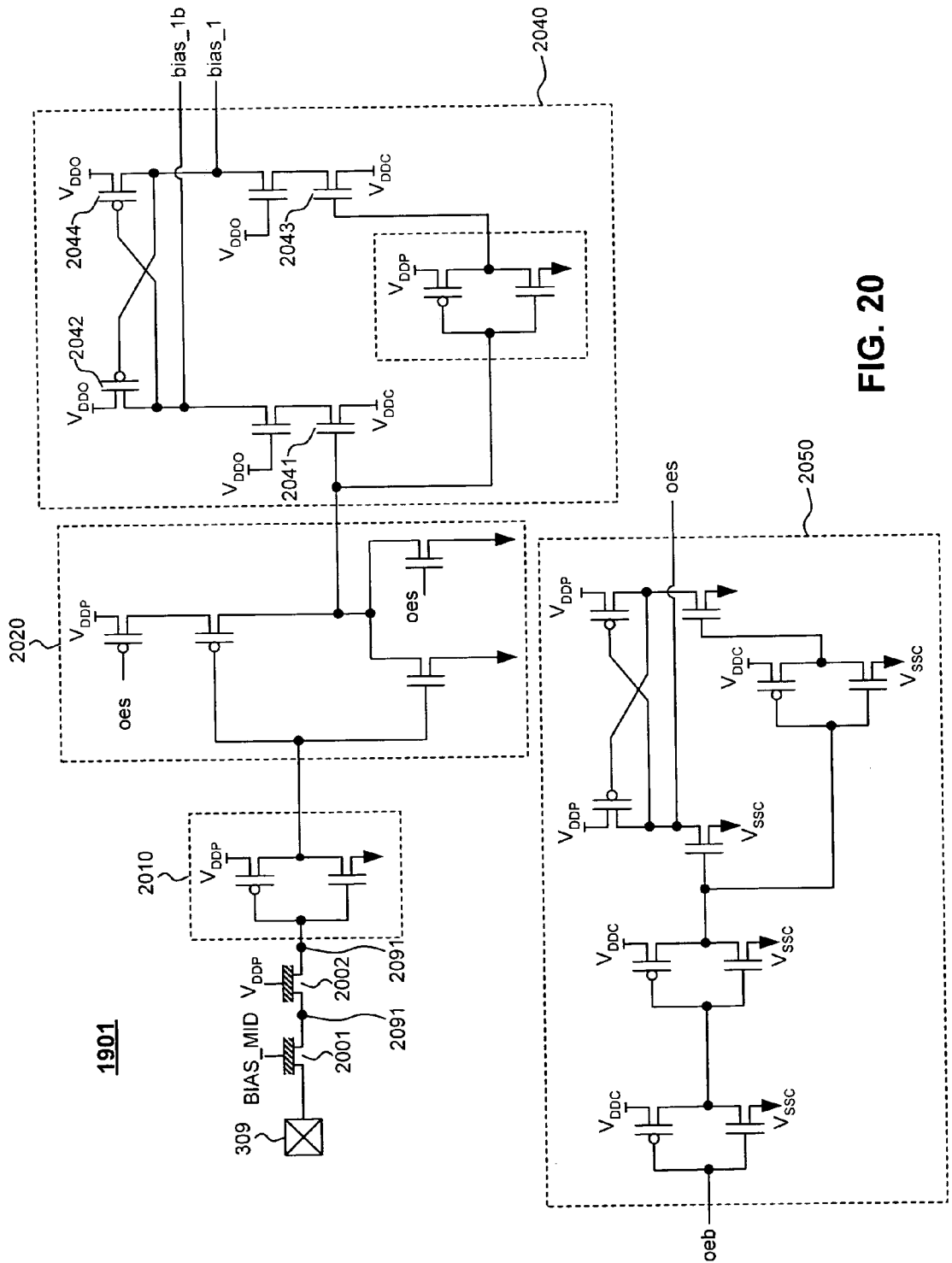
FIG. 20 is a transistor implementation of an alternate embodiment of block 901 of the circuit depicted in FIG. 16 of this disclosure.

FIG. 20 is one embodiment of reference circuit 1901, which generates voltages bias_1b and bias_1 in normal mode. In the normal mode, pass transistor devices 2001 and 2002 protect reference circuit 1901 from excessive I/O pad voltage. If $V_{PAD}$ 309 rises above the voltage Bias_Mid, then device 2001 will charge node 2090 to Bias_Mid minus the threshold voltage of device 2001, thus protecting device 2001 from overstress. Similarly, if $V_{PAD}$ 309 rises above $V_{DDP}$, device 2002 will charge node 2091 to $V_{DDP}$ minus the threshold voltage of device 2002, thus protecting device 2002 and inverter 2010 from overstress.

While in normal mode, inverters 2010 and 2020 act as buffers between the I/O pad voltage 309 and comparator 2040. Inverter 2020 is controlled by output enable signal ("oes"), generated by output enable circuit 2050. If "oes" is low, inverter 2020 will invert the output of inverter 2010. If "oes" is high, the output of inverter 2020 is low. The input of output enable circuit 2050 is "oeb" and is either an external, user defined input, or an internally generated signal. Inverter 2030 coupled the gates of NMOS transistors 2041 and 2043 of comparator 2040. The gates of PMOS transistors 2042 and 2044 are cross connected to each others sources.

Still in the normal mode, where $V_{PAD}$ 309 is in normal operating range (e.g., 0–3.3V) bias_1b and bias_1 will toggle between $V_{DDO}$ and $V_{DDC}$, depending on the I/O pad voltage. For example, where $V_{PAD}$ is HIGH, output of inverter 2010 is LOW, and output of inverter 2020 is HI. As a result, a HIGH signal is at the gate of NMOS transistor 2041, causing transistor 2041 to conduct, while inverter 2030 puts a LOW signal to the gate of NMOS transistor 2043, causing transistor 2043 to turn off. Thus, bias_1b is equal to $V_{DDC}$ (e.g., 1.2V). This, in turn, puts $V_{DDC}$ at the gate of PMOS transistor 2044, causing it to conduct. As a result, bias_1 is equal to $V_{DDO}$ (e.g., 3.3V), which also ensures that PMOS transistor 2042 is off. If $V_{PAD}$ is LOW, the reverse is true and bias_1 goes to $V_{DDC}$ (e.g., 1.2V), while bias_1b goes to $V_{DDO}$ (e.g., 3.3V).

In power management mode, one or more supply voltages $V_{DDO}$, $V_{DDC}$ and $V_{DDP}$ are powered off. In this state, the output of reference circuit 1901 is low—i.e., both bias_1 and bias_1b are low. As is explained in more detail below with respect to FIG. 21, reference circuit 1901 is effectively de-coupled from Bias_Mid and $V_{GP1}$ in power management mode by switches 1950 and 1955.

Figure 21:
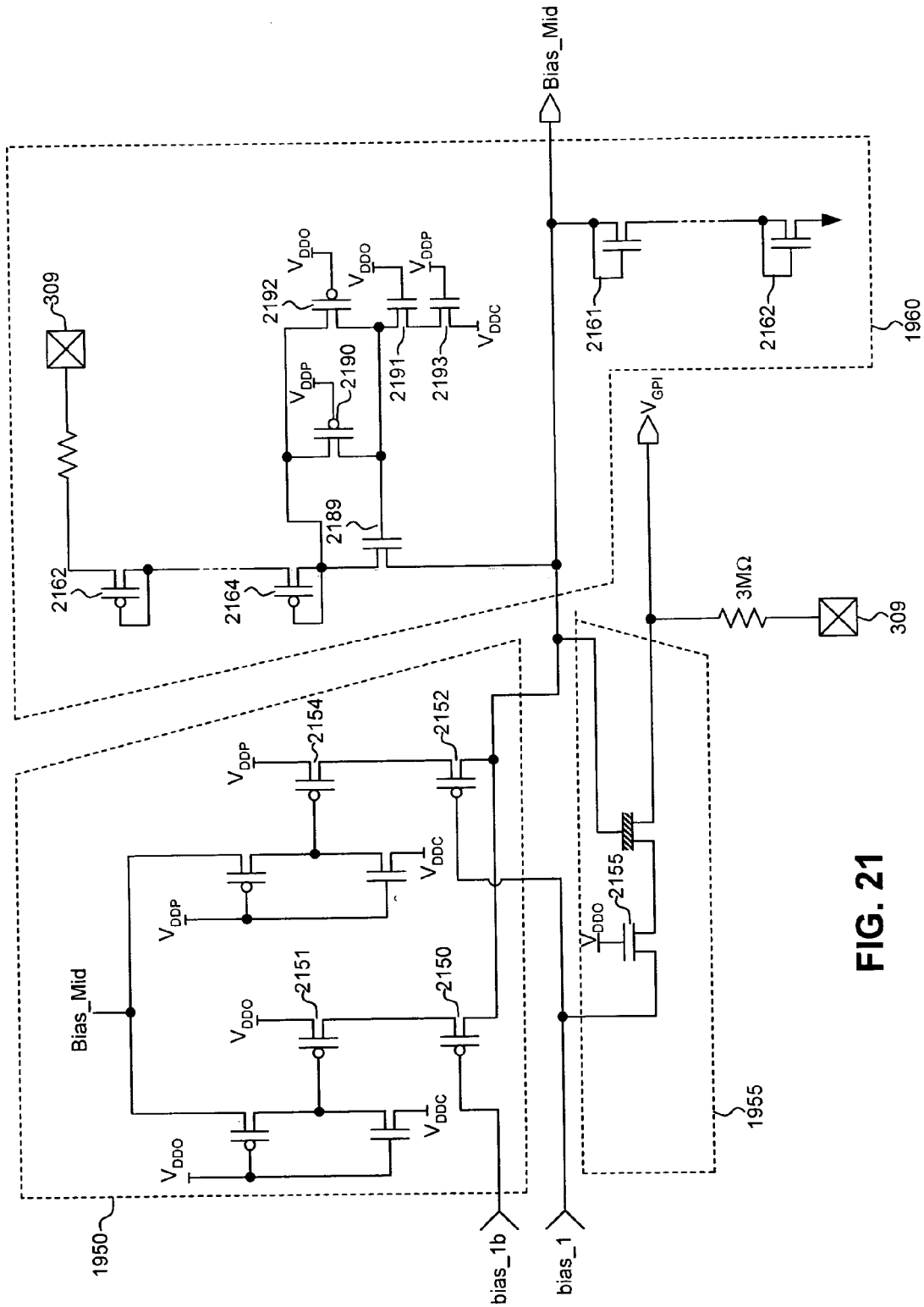
FIG. 21 is a transistor implementation of an alternate embodiment of block 1401 of the circuit depicted in FIG. 16 of this disclosure.

FIG. 21 is a transistor implementation of switches 1950, 1955 and self-bias circuit 1960. Switch 1950 is one embodiment of circuit 1401. In normal mode, switch 1950 receives bias_1b and bias_1 at the gates of PMOS transistors 2150 and 2152 respectively. If bias_1b is LOW (e.g., bias_1b=$V_{DDC}$=1.2 V, where $V_{PAD}$ is HIGH), PMOS transistor 2150 is on, and $V_{DDO}$ (e.g., 3.3V) is supplied to Bias_Mid. If bias_1 is LOW (e.g., bias_1=$V_{DDC}$=1.2 V, where $V_{PAD}$ is LOW), PMOS transistor 2152 is on, and intermediate supply voltage $V_{DDP}$ (e.g., 2.5V) is supplied to Bias_Mid.

In power management mode, switch 1950 isolates reference circuit 1901 and power supplies $V_{DDO}$ and $V_{DDP}$ from self bias circuit 1960. Where $V_{DDO}$ and $V_{DDP}$ are powered off, the gates of 2151 and 2154 are tied up to Bias_Mid. This causes transistors 2151 and 2154 remain off. Thus, transistors 2151 and 2154 serve to de-couple $V_{DDO}$ and $V_{DDP}$, as well as circuit 1901, from Bias_Mid. In this fashion, circuit 1950 can be modeled as a switch that is responsive to reference voltages from reference circuit 1901, as well as to supply voltages $V_{DDO}$ and $V_{DDP}$.

Circuit 1955 also acts as a switch in power management mode. Ordinarily, bias_1 is supplied to $V_{GP1}$ through circuit 1955. However, because NMOS transistor 2155 has its gate tied to reference voltage $V_{DDO}$, it conducts when $V_{DDO}$ is at is nominal value of 3.3V, and is off if supply voltage $V_{DDO}$ is off. Therefore, bias_1 is not supplied to $V_{GP1}$ when in power management mode, since $V_{DDO}$ is powered off. In this fashion, circuit 1955 can also be modeled as a switch that is responsive to reference voltages from reference circuit 1901, as well as supply voltage $V_{DDO}$.

Self-bias circuit 1960 generates Bias_Mid when the I/O circuit is in power management mode, or when $V_{PAD}$ is excessively high. In self-bias circuit 1960, it can be seen that Bias_Mid will be represented by the following relationship:

$$(V_{SSC}+nV_{TN}) > \text{Bias\_Mid} > (V_{PAD}-kV_{TP})$$

where $V_{TN}$ is the threshold voltage for NMOS devices, n is the number of NMOS devices 2161–2163 connected in series between Bias_Mid and $V_{SSC}$ (ground or 0V), $V_{TP}$ is the threshold voltage for PMOS devices, and k is the number of PMOS devices 2162–2164 connected in series between Bias_Mid and $V_{PAD}$. In normal mode, transistor 2189 isolates transistor string 2162–2164 when supply voltages are present. Where $V_{DDO}$ and $V_{DDP}$ are present, transistors 2191 and 2193 both are on. This puts low voltage $V_{DDC}$ at the gate of transistor 2189, turning it off. In power management mode, where $V_{DDO}$ or $V_{DDP}$ are off, PMOS transistors 2190 and 2192 conduct. This puts the voltage of the source of transistor 2189 at the gate of transistor 2189, thus making transistor 2189 act as a diode, allowing I/O pad voltage 309 to be dropped across the 250 ohm resistor and transistor string 2162–2164. Thus, in power management mode, Bias_Mid depends only on the value of $V_{PAD}$, and does not rely on the plurality of supply voltages.

Figure 22:
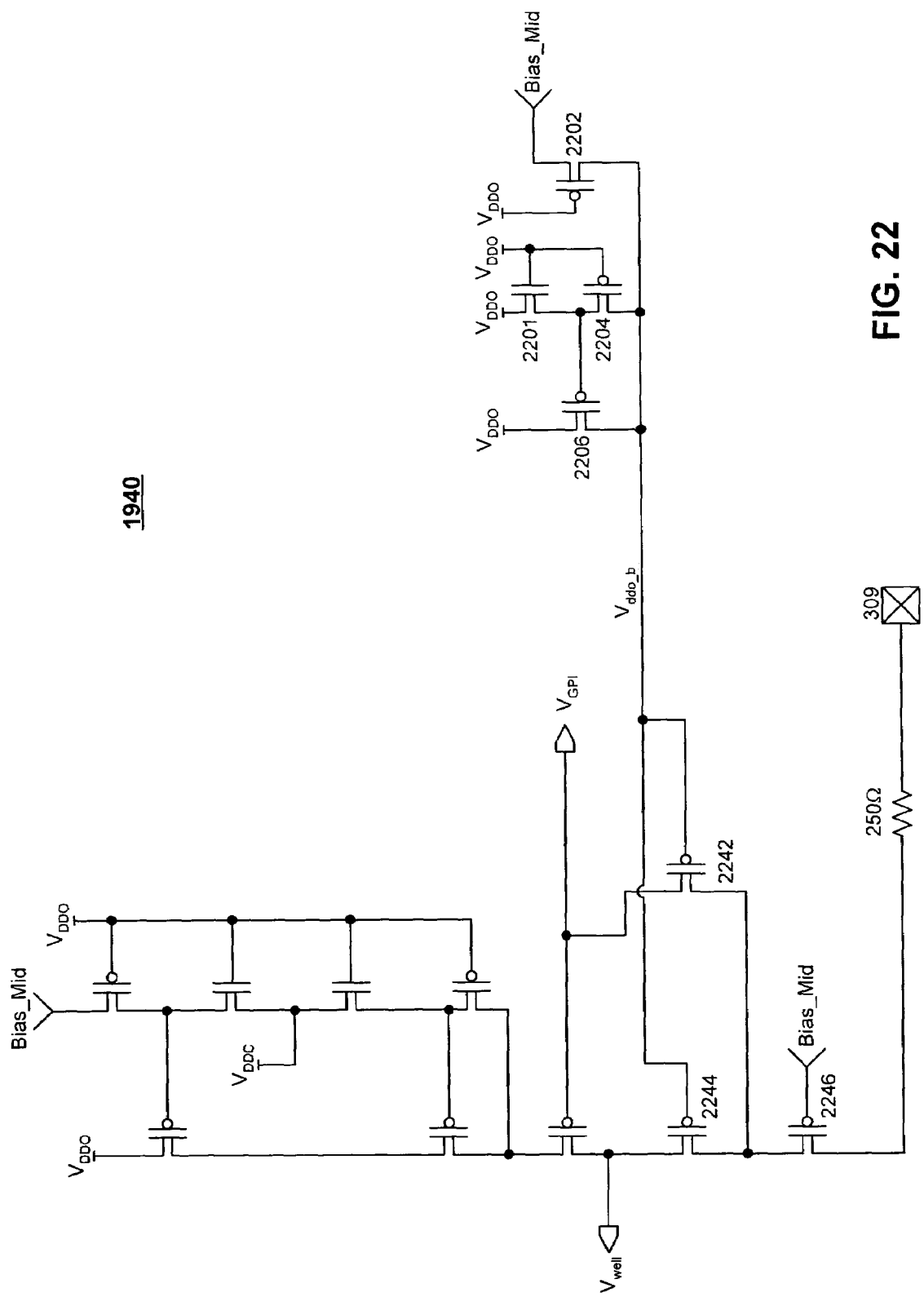
FIG. 22 is a transistor implementation of an alternate embodiment of block 405 and 401 of the circuit depicted in FIG. 6 of this disclosure.

FIG. 22 is a transistor implementation of self-bias circuit 1940, which is one embodiment of circuits 405 and 401 of the circuit depicted in FIG. 6. In power management mode, self-bias circuit 1940 generates $V_{GP1}$. When the supply voltage $V_{DDO}$ is powered off, PMOS transistors 2202 and 2204 both turn on. NMOS transistor 2201 turns off. As a result, PMOS transistor 2206 turns off and $V_{DDO\_b}$ thus goes to Bias_Mid that is generated by circuit 1960, which is applied to the gates of PMOS transistors 2242 and 2244. In this fashion, transistor 2202 acts as a switch isolating circuit 1960 from 1940 when $V_{DDO}$ is present, and providing Bias_Mid to circuit 1940 when $V_{DDO}$ is absent.

Bias_Mid is also applied to the gate of PMOS device 2246. Thus, $V_{GP1}$ will depend on the value of both Bias_Mid, which is supplied from self-bias circuit 1960, and $V_{PAD}$. If Bias_Mid is sufficiently low compared to $V_{PAD}$, devices 2242 and 2246 will be on, and $V_{GP1}$ will be equal to $V_{PAD}$ dropped across the 250 Ω resistor and PMOS transistors 2242 and 2246. Thus, $V_{GP1}$ would be approximately equal to $V_{PAD} - kV_{TP}$ wherein k is the number of said PMOS devices between transistors 2242 and 2246, and $V_{TP}$ is the threshold voltage of said PMOS devices. Self-bias circuit 1940 also generates $V_{WELL}$. $V_{WELL}$ is biased in all cases to the highest potential as between $V_{DDO}$ and $V_{PAD}$. Such self-biasing prevents latch-up problems in PMOS devices 301 and 303. If Bias_Mid is not sufficiently low compared to $V_{PAD}$, then $V_{GP1}$ will be equal to $V_{PAD}$ dropped across the 3 MΩ resistor, as shown in FIG. 21.

CONCLUSION

These embodiments are provided by way of example and not limitation. They describe an apparatus and method for properly biasing the I/O circuit when the plurality of reference voltages are powered off, i.e., when the I/O circuit is in the power management mode. One skilled in the art would recognize other circuit designs that could implement the inventive concept of this disclosure.

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A circuit comprising:

an I/O pad;

a pull-down transistor device having a first protective transistor, the pull-down transistor device being configured for coupling to the I/O pad;

a pull-up transistor device having a second protective transistor, the pull-up transistor device being configured for coupling to the I/O pad;

means for biasing the first and second protective transistors using a plurality of supply voltages; and means for biasing the first and second protective transistors using a voltage at the I/O pad when one or more of the plurality of supply voltages are off.

2. The circuit of claim 1, further comprising:

a floating well on which the pull-up transistor device is fabricated; and means for biasing the floating well when one or more of the plurality of supply voltages are off.

* * * * *